(12) United States Patent
Kato et al.

(10) Patent No.: US 9,023,738 B2
(45) Date of Patent: *May 5, 2015

(54) FILM DEPOSITION METHOD

(71) Applicant: Tokyo Electron Limited, Tokyo (JP)

(72) Inventors: Hitoshi Kato, Iwate (JP); Tatsuya Tamura, Iwate (JP); Takeshi Kumagai, Iwate (JP)

(73) Assignee: Tokyo Electron Limited, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/458,319

(22) Filed: Aug. 13, 2014

(65) Prior Publication Data

US 2014/0349032 A1 Nov. 27, 2014

Related U.S. Application Data

(63) Continuation of application No. 13/726,731, filed on Dec. 26, 2012, now Pat. No. 8,835,332.

(30) Foreign Application Priority Data

Dec. 27, 2011 (JP) .................. 2011-285850

(51) Int. Cl.
| | | |
|---|---|---|
| H01L 21/00 | (2006.01) | |
| C23C 16/455 | (2006.01) | |
| H01L 21/30 | (2006.01) | |
| H01L 21/02 | (2006.01) | |
| C23C 16/04 | (2006.01) | |
| C23C 16/40 | (2006.01) | |
| H01L 21/762 | (2006.01) | |
| C23C 14/00 | (2006.01) | |

(52) U.S. Cl.
CPC .......... *C23C 16/45536* (2013.01); *H01L 21/30* (2013.01); *H01L 21/02164* (2013.01); *H01L 21/0228* (2013.01); *H01L 21/76224* (2013.01); *C23C 16/045* (2013.01); *C23C 16/402* (2013.01); *C23C 16/45519* (2013.01); *C23C 16/45551* (2013.01); *C23C 14/00* (2013.01); *C23C 16/45529* (2013.01)

(58) Field of Classification Search
CPC .............. C23C 14/00; C23C 16/45529; H01L 21/76224
USPC .................................... 438/787–790
See application file for complete search history.

(56) References Cited

U.S. PATENT DOCUMENTS

| | | | |
|---|---|---|---|
| 7,981,815 B2 | 7/2011 | Miya et al. | |
| 8,835,332 B2 * | 9/2014 | Kato et al. | 438/787 |
| 2005/0032372 A1 | 2/2005 | Ko et al. | |
| 2008/0242097 A1 | 10/2008 | Boescke et al. | |

FOREIGN PATENT DOCUMENTS

| | | |
|---|---|---|
| JP | 2007-042884 | 2/2007 |
| JP | 2009-212303 | 9/2009 |
| JP | 2011-054742 | 3/2011 |
| JP | 2011-216862 | 10/2011 |
| WO | 2008/010546 | 1/2008 |

* cited by examiner

*Primary Examiner* — Richard Booth
(74) *Attorney, Agent, or Firm* — IPUSA, PLLC

(57) ABSTRACT

A film deposition method, in which a film of a reaction product of a first reaction gas, which tends to be adsorbed onto hydroxyl radicals, and a second reaction gas capable of reacting with the first reaction gas is formed on a substrate provided with a concave portion, includes a step of controlling an adsorption distribution of the hydroxyl radicals in a depth direction in the concave portion of the substrate; a step of supplying the first reaction gas on the substrate onto which the hydroxyl radicals are adsorbed; and a step of supplying the second reaction gas on the substrate onto which the first reaction gas is adsorbed.

19 Claims, 18 Drawing Sheets

FIG.18

FILM DEPOSITION METHOD

CROSS-REFERENCE TO RELATED APPLICATION

This application is a continuation application of U.S. patent application Ser. No. 13/726,731 filed on Dec. 26, 2012, which claims the benefit of priority of Japanese Priority Application No. 2011-285850 filed on Dec. 27, 2011, where the entire contents of both of these applications are incorporated herein by reference.

BACKGROUND OF THE INVENTION

1. Field of the Invention

The present invention relates to a film deposition method.

2. Description of the Related Art

A manufacturing process of an integrated circuit (IC) includes a process of filling a concave portion such as a trench, a via hole, a space of a line and space pattern or the like, with silicon oxide. For example, when depositing the silicon oxide in the trench by chemical vapor deposition (CVD), a phenomenon in which the thickness of the silicon oxide becomes greater near the aperture of the trench (so-called an "overhang" is formed) occurs because reaction gasses (precursor) react in a gas phase before reaching the bottom portion of the trench, or are adsorbed onto the side surface of the trench. Further, when the aperture of the trench is blocked by the silicon oxide, there may be a case in which a void is formed in the trench (see Patent Document 1, for example).

Here a film deposition method so-called "atomic layer deposition" (ALD) (or a "molecular layer deposition": MLD) is known in which two kinds of reaction gasses, which react with each other, are alternately supplied onto the substrate to form a reaction product of the reaction gasses on the substrate. In this film deposition method, as the reaction product is formed by reacting one of the reaction gasses adsorbed onto a lower layer with the other of the reaction gasses, a film which more nearly reflects the shape of the lower layer can be formed compared with the CVD method. It means that the generation of the overhang or the void can be reduced by the ALD method.

However, in accordance with a requirement of high integration of the IC, an aspect ratio of the concave portion such as the trench or the like increases. Thus, when using the ALD method, it is required that the thickness distribution of the thin film formed in the concave portion such as the trench or the like is controlled as well as forming the thin film in the trench or the like without the void.

PATENT DOCUMENT

[Patent Document 1] Japanese Laid-open Patent Publication No. 2007-42884
[Patent Document 2] WO2008/010546

SUMMARY OF THE INVENTION

The present invention is made in light of the above problems, and provides a film deposition method capable of controlling a distribution of film thickness when depositing a film in a concave portion provided on a substrate.

According to an embodiment, there is provided a film deposition method, in which a film of a reaction product of a first reaction gas, which tends to be adsorbed onto hydroxyl radicals, and a second reaction gas capable of reacting with the first reaction gas is formed on a substrate provided with a concave portion, the method including a step of controlling an adsorption distribution of the hydroxyl radicals in a depth direction in the concave portion of the substrate; a step of supplying the first reaction gas on the substrate onto which the hydroxyl radicals are adsorbed; and a step of supplying the second reaction gas on the substrate onto which the first reaction gas is adsorbed.

Note that also arbitrary combinations of the above-described constituents, and any exchanges of expressions in the present invention, made among methods, devices, systems and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

FIG. 18 is a view showing a result of an example.

DETAILED DESCRIPTION OF THE PREFERRED EMBODIMENTS

Figure 1:
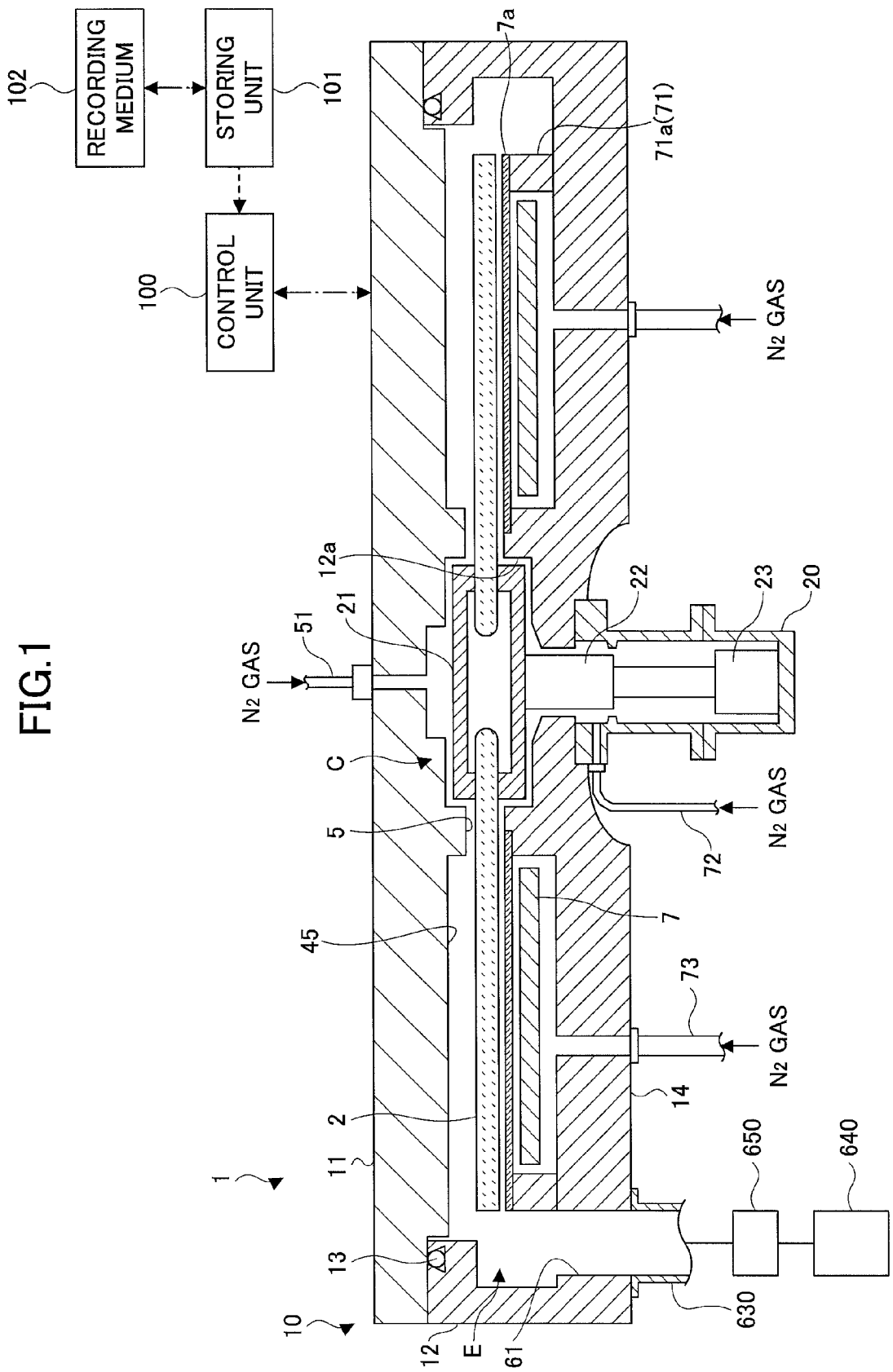
FIG. 1 a cross-sectional view of an example of a film deposition apparatus of an embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated. Further, drawings are not intended to show relative ratios of a component or components.

(Film Deposition Apparatus)

First, a film deposition apparatus for performing a film deposition method of the embodiment is explained.

FIG. 1 is a cross-sectional view of an example of a film deposition apparatus 1 of the embodiment.

The film deposition apparatus 1 includes a vacuum chamber 10, a turntable 2, a heater unit 7, a case body 20, a core unit 21, a rotary shaft 22, and a driving unit 23. The vacuum chamber 10 has a substantially flat circular shape. The vacuum chamber 10 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 10 and has a center of rotation at the center of the vacuum chamber 10. The turntable 2 is attached to the cylindrical shaped core unit 21 at its center portion. The core unit 21 is fixed to the upper end of the rotary shaft 22 which extends in the vertical direction. The rotary shaft 22 is provided to penetrate the bottom portion 14 of the vacuum chamber 10 and its lower end is attached to the driving unit 23 that rotates the rotary shaft 22 (FIG. 1) around a vertical direction. The rotary shaft 22 and the driving unit 23 are housed in the tubular case body 20 whose upper surface is open. The case body 20 is attached to a lower surface of the bottom portion 14 of the vacuum chamber 10 via a flange portion provided at its upper surface in an airtight manner so that inner atmosphere of the case body 20 is isolated from outside atmosphere.

Figure 2:
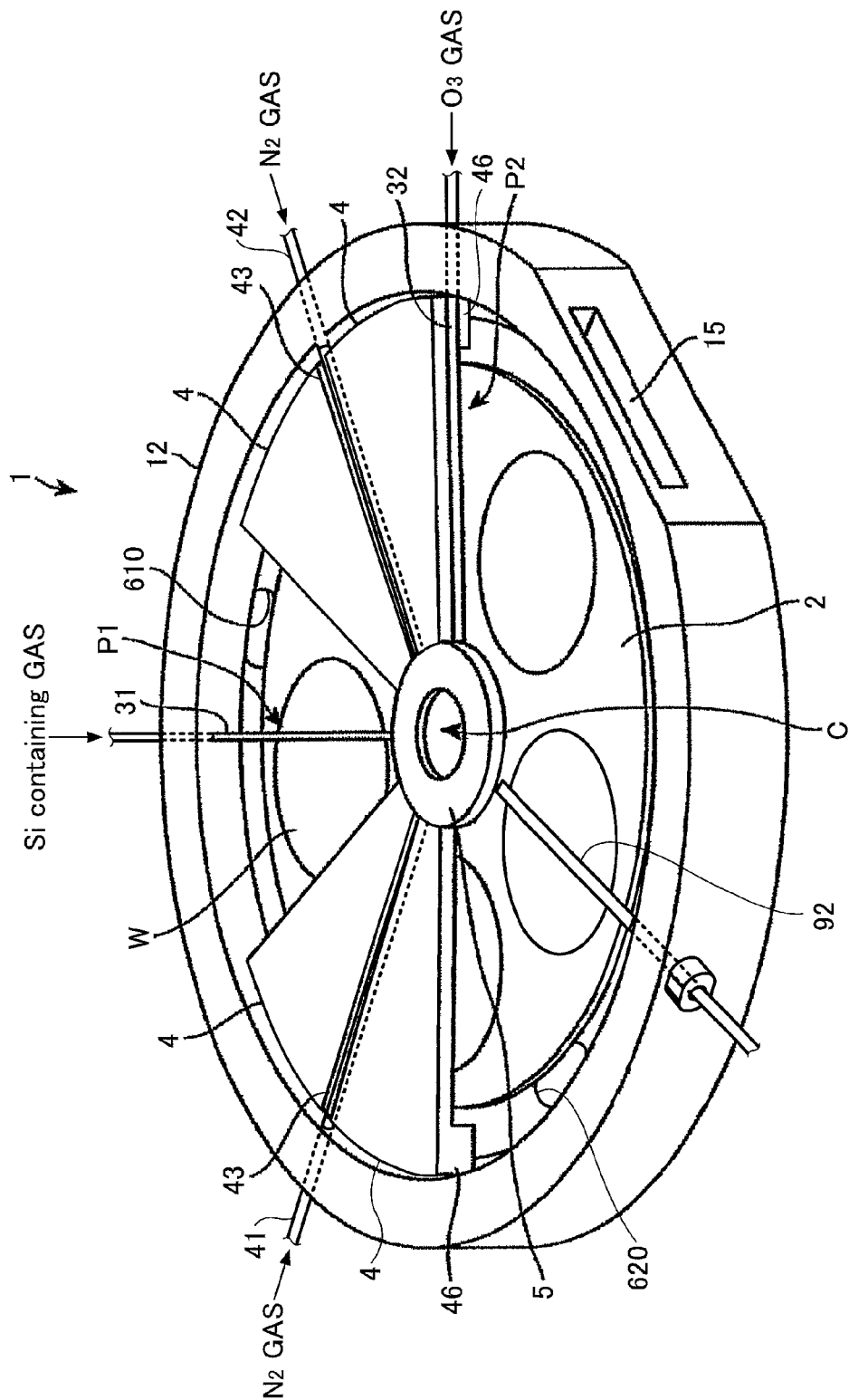
FIG. 2 is a perspective view showing an inside structure of a vacuum chamber of the film deposition apparatus shown in FIG. 1.
Figure 3:
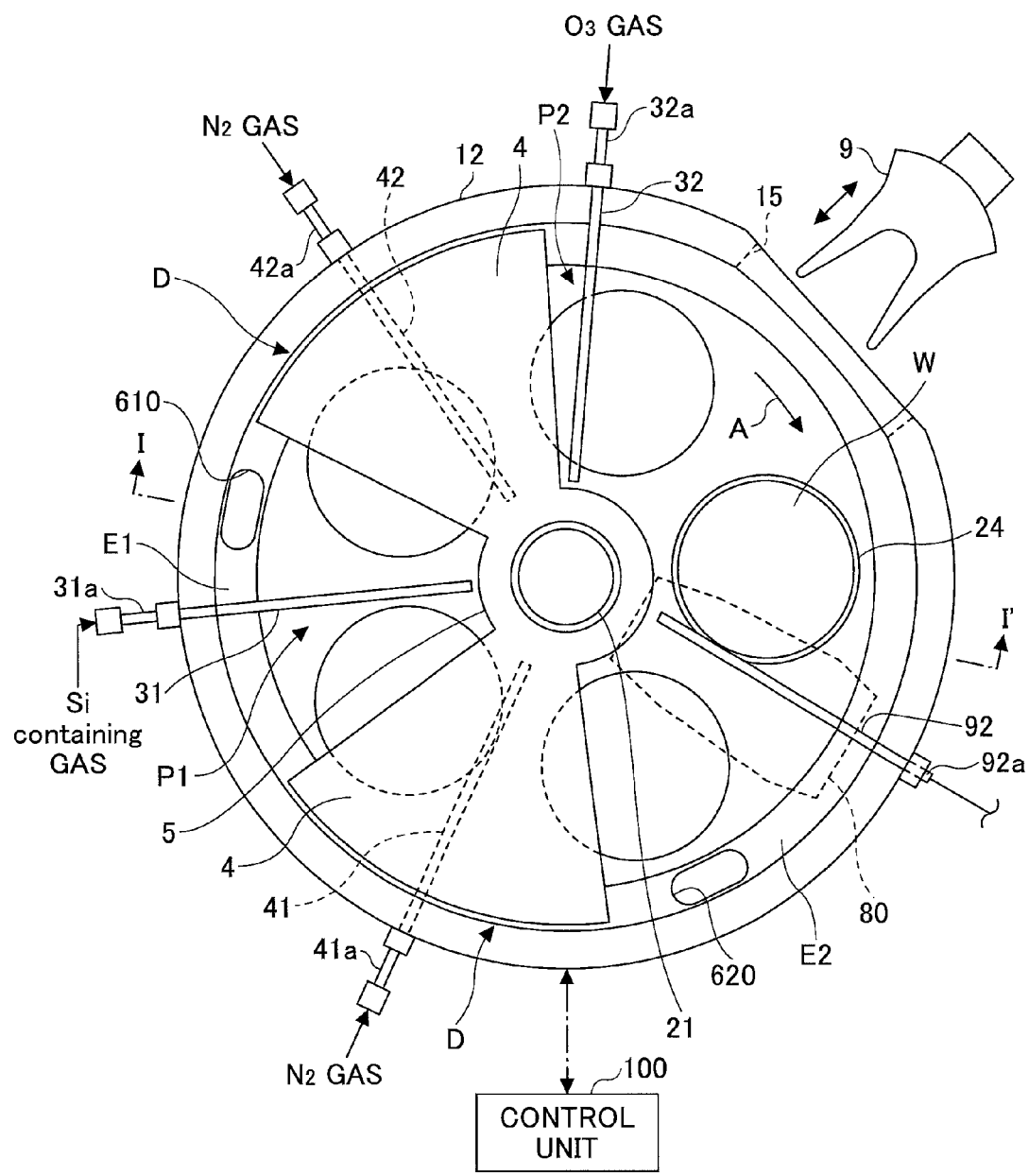
FIG. 3 is a schematic top view showing an example of the vacuum chamber of the film deposition apparatus shown in FIG. 1.

FIG. 2 and FIG. 3 are views showing an inside structure of the vacuum chamber 10. The ceiling plate 11 is not shown in FIG. 2 and FIG. 3 for an explanatory purpose.

As shown in FIG. 2 and FIG. 3, plural (five in this case) circular concave portions 24 are provided at a front surface of the turntable 2 along a rotating direction (circumferential direction) shown by an arrow A for holding plural semiconductor wafers (which will be simply referred to as "wafers" hereinafter) W, respectively. Here is an example where the wafer W is shown to be placed in one of the concave portions 24 in FIG. 3 for an explanatory purpose.

Each of the concave portions 24 is formed to have a slightly larger (for example, 4 mm larger) diameter than that (for example, 300 mm) of the wafer W, and a depth substantially equal to the thickness of the wafer W. Thus, when the wafer W is mounted in the respective concave portion 24, the surface of the wafer W and the surface of the turntable 2 (where the wafer W is not mounted) become almost the same height.

As will be explained later, each of the concave portions 24 are provided with three, for example, through holes, through which lift pins for supporting a back surface of the respective wafer W and lifting the wafer W penetrate.

A reaction gas nozzle 31, a reaction gas nozzle 32, separation gas nozzles 41 and 42, and a gas introduction nozzle 92, which are made of quartz, for example, are provided above the turntable 2. For the example shown in FIG. 3, the gas introduction nozzle 92, the separation gas nozzle 41, the reaction gas nozzle 31, the separation gas nozzle 42, and the reaction gas nozzle 32 are aligned in this order from a transfer port 15 (which will be explained later) in a clockwise direction (the rotation direction of the turntable 2 as shown by an arrow A in FIG. 3) with a space therebetween in a circumferential direction of the vacuum chamber 10. Gas introduction ports 92a, 31a, 32a, 41a, and 42a (FIG. 3) which are base portions of the nozzles 92, 31, 32, 41, and 42, respectively, are fixed to an outer peripheral wall of the fixing chamber body 12 so that these nozzles 92, 31, 32, 41, and 42 are introduced into the vacuum chamber 10 from the outer peripheral wall of the vacuum chamber 10 to extend in a radial direction and parallel to the surface of the turntable 2.

As simply shown by a dotted line for an explanatory purpose in FIG. 3, a plasma generating device 80 is provided above the gas introduction nozzle 92. The plasma generating device 80 is explained later.

In this embodiment, the reaction gas nozzle 31 is connected to a supplying source (not shown in the drawings) of a Si (silicon) containing gas as a first reaction gas via a pipe, a flow controller and the like (not shown in the drawings). The reaction gas nozzle 32 is connected to a supplying source (not shown in the drawings) of an oxidation gas as a second reaction gas via a pipe, a flow controller and the like (not shown in the drawings). The separation gas nozzles 41 and 42 are connected to supplying sources (not shown in the drawings) of nitrogen ($N_2$) gas as a separation gas via pipes and flow controller valves and the like, respectively.

In this embodiment, organo-aminosilane gas is used as the Si containing gas, and $O_3$ (ozone) gas is used as the oxidation gas.

The reaction gas nozzles 31 and 32 are provided with plural gas discharge holes 33 (see FIG. 4) which are facing downward to the turntable 2 along the longitudinal directions of the reaction gas nozzles 31 and 32 with a 10 mm interval, respectively, for example. An area below the reaction gas nozzle 31 is a first process area P1 in which the Si containing gas is adsorbed onto the wafers W. An area below the reaction gas nozzle 32 is a second process area P2 in which the Si containing gas which is adsorbed onto the wafer W at the first process area P1 is oxidized.

Referring to FIG. 2 and FIG. 3, the ceiling plate 11 is provided with two protruding portions 4 protruding in the vacuum chamber 10. Each of the protruding portions 4 has substantially a sector top view shape where the apex is removed in an arc shape. For each of the protruding portions 4, the inner arc shaped portion is connected to an inner protruding portion 5 (which will be explained later with reference to FIG. 1 to FIG. 3) and the outer arc shaped portion is formed to extend along an inner peripheral surface of the chamber body 12 of the vacuum chamber 10. As will be explained later, the protruding portions are attached at a lower surface of the ceiling plate 11 to protrude toward the turntable 2 to form separation areas D with the corresponding separation gas nozzles 41 and 42.

Figure 4:
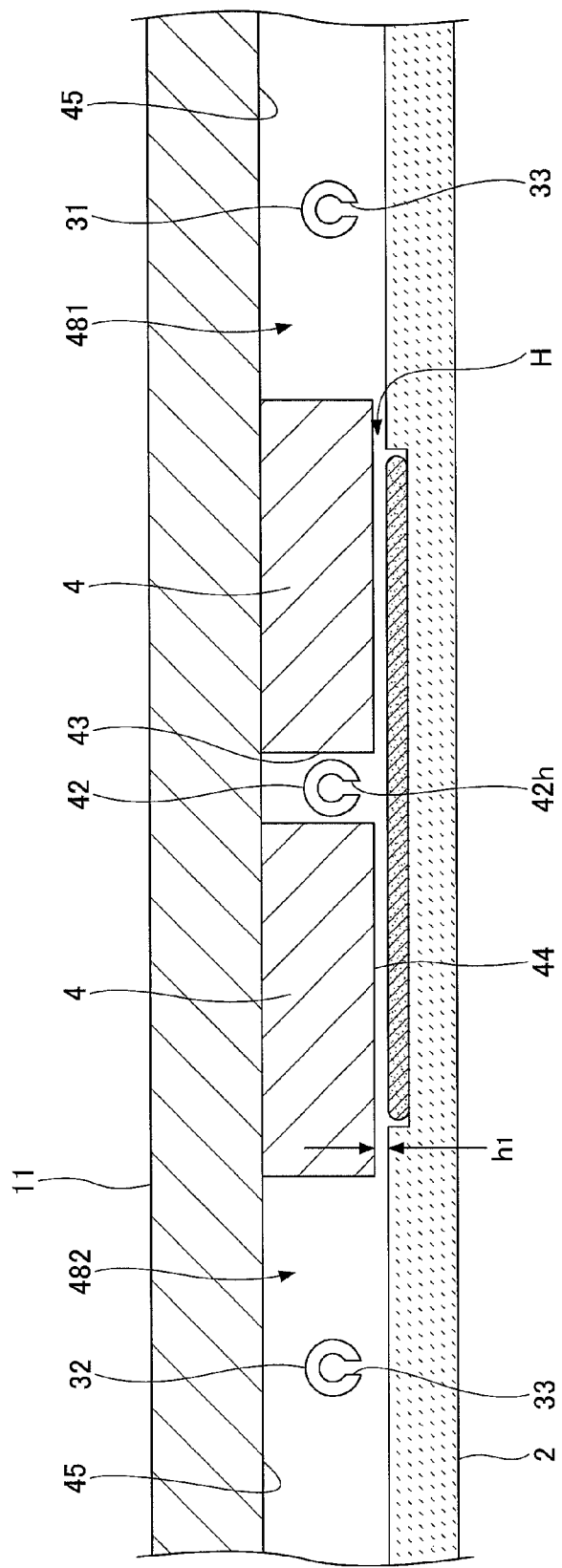
FIG. 4 is a partial cross-sectional view of an example of the film deposition apparatus shown in FIG. 1.

FIG. 4 shows a cross-section of the vacuum chamber 10 along a concentric circle of the turntable 2 from the reaction gas nozzle 31 to the reaction gas nozzle 32. As shown in FIG. 4, the protruding portion 4 is fixed to the lower surface of the ceiling plate 11. Thus, there are provided a flat low ceiling surface 44 (first ceiling surface) formed as the lower surface of the protruding portion 4 and flat higher ceiling surfaces 45 (second ceiling surface) which are higher than the low ceiling surface 44 and formed at outboard sides of the low ceiling surface 44 in the circumferential direction. The low ceiling surface 44 has substantially a sector top view shape where the apex is removed in an arc shape.

Further, as shown in the drawings, the protruding portion 4 is provided with a groove portion 43 at a center in the circumferential direction. The groove portion 43 is formed to extend in the radius direction of the turntable 2. The separation gas nozzle 42 is positioned within the groove portion 43.

Although not shown in FIG. 4, the separation gas nozzle 41 is also positioned within a groove portion provided in the other protruding portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, for an explanatory purpose, a space below the high ceiling surface 45 where the reaction gas nozzle 31 is provided is referred to as "481" and a space below the high ceiling surface 45 where the reaction gas nozzle 32 is provided is referred to as "482" as shown in FIG. 4.

The separation gas nozzle 42 is provided with plural gas discharge holes 42h formed along the longitudinal direction of the separation gas nozzle 42 with a predetermined interval (10 mm, for example).

The low ceiling surface 44 provides a separation space H, which is a small space, with respect to the turntable 2. When the $N_2$ gas is provided from the separation gas nozzle 42, the $N_2$ gas flows toward the space 481 and the space 482 through the separation space H. At this time, as the volume of the separation space H is smaller than those of the spaces 481 and 482, the pressure in the separation space H can be made higher than those in the spaces 481 and 482 by the $N_2$ gas. It means that between the spaces 481 and 482, the separation space H provides a pressure barrier.

Further, the $N_2$ gas flowing from the separation space H toward the spaces 481 and 482 functions as a counter flow against the Si containing gas from the gas first process area P1 and the oxidation gas from the second process area P2. Thus, the Si containing gas from the first process area P1 and the oxidation gas from the second process area P2 are separated by the separation space H. Therefore, mixing and reacting of the Si containing gas with the oxidation gas are prevented in the vacuum chamber 10.

The height h1 of the low ceiling surface 44 above an upper surface of the turntable 2 may be appropriately determined based on the pressure of the vacuum chamber 10 at a film deposition time, the rotational speed of the turntable 2, and a supplying amount of the separation gas ($N_2$ gas) in order to maintain the pressure in the separation space H higher than those in the spaces 481 and 482.

Referring to FIG. 1 to FIG. 3, the ceiling plate 11 is further provided with the inner protruding portion 5 at its lower surface to surround the outer periphery of the core unit 21 which fixes the turntable 2. The inner protruding portion 5 is continuously formed with the inner portions of the protruding portions 4 and has a lower surface which is formed at the same height as those of the low ceiling surfaces 44, in this embodiment.

Figure 5:
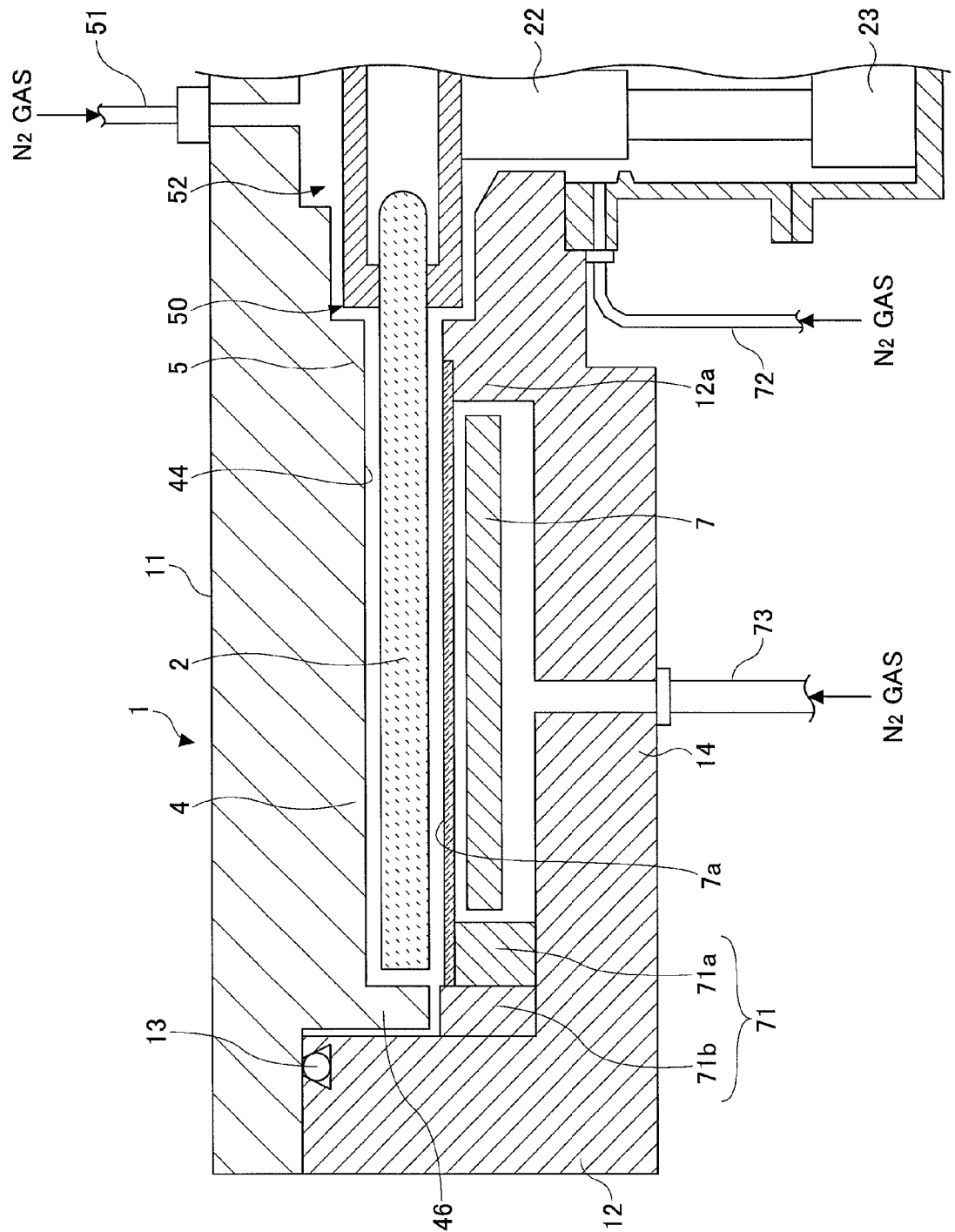
FIG. 5 is a partial cross-sectional view of an example of the film deposition apparatus shown in FIG. 1

FIG. 1 is a cross-sectional view taken along an I-I' line in FIG. 3, and showing an area where the ceiling surface 45 is provided. FIG. 5 is a partial cross-sectional view showing an area where the ceiling surface 44 is provided.

As shown in FIG. 5, the protruding portion 4 having a substantially sector top view shape is provided with an outer bending portion 46 at its outer peripheral end portion (at an outer peripheral end portion side of the vacuum chamber 10) which is bent to have an L-shape to face an outer end surface of the turntable 2. The outer bending portion 46 suppresses a flow of gas between the space 481 and the space 482 through the space between the turntable 2 and the inner peripheral surface of the chamber body 12. As described above, the protruding portions 4 are provided on the ceiling plate 11 which is detachably attached to the chamber body 12. Thus, there is a slight space between the outer periphery surface of the outer bending portion 46 and the chamber body 12. The space between the inner periphery surface of the outer bending portion 46 and an outer surface of the turntable 2, and the space between the outer periphery surface of the outer bending portion 46 and the chamber body 12 may be a size same as the height h1 (see FIG. 4) of the low ceiling surface 44 with respect to the upper surface of the turntable 2, for example.

As shown in FIG. 5, the inside perimeter wall of the chamber body 12 is provided to extend in a vertical direction to be closer to the outer peripheral surface of the outer bending portion 46 at the separation area H. However, other than the separation area H, as shown in FIG. 1, for example, the inside perimeter wall of the chamber body 12 is formed to have a concave portion outside of a portion facing the outer end surface of the turntable 2 toward the bottom portion 14. Hereinafter, for an explanatory purpose, the concave portion, having a substantially rectangular cross-sectional view, is referred to as an "evacuation area". Specifically, a part of the evacuation area which is in communication with the first process area P1 is referred to as a first evacuation area E1, and a part of the evacuation area which is in communication with the second process area P2 is referred to as a second evacuation area E2. As shown in FIG. 1 to FIG. 3, a first evacuation port 610 and a second evacuation port 620 are respectively provided at the bottom portions of the first evacuation area E1 and the second evacuation area E2. The first evacuation port 610 and the second evacuation port 620 are connected to vacuum pumps 640, which are vacuum evacuation units, via evacuation pipes 630, respectively, as shown in FIG. 1. The reference numeral 650 is a pressure regulator in FIG. 1.

The heater unit 7 is provided at a space between the turntable 2 and the bottom portion 14 of the vacuum chamber 10 as shown in FIG. 1 and FIG. 5. The wafers W mounted on the turntable 2 are heated by the heater unit 7 via the turntable 2 to a temperature (450° C., for example) determined by a process recipe. A ring cover member 71 is provided at a lower portion side of the outer periphery of the turntable 2 in order to prevent gasses from being introduced into the space below the turntable 2.

As shown in FIG. 5, the cover member 71 includes an inner member 71a which is provided to face the outer edge portion and the further outer portion of the turntable 2 from a lower side, and an outer member 71b which is provided between the inner member 71a and an inner wall surface of the chamber body 12. The outer member 71b is provided to face the outer bending portion 46, which is formed at an outer edge portion at lower side of each of the protruding portions 4. The inner member 71a is provided to surround the entirety of the heater unit 7 below the outer end portion (and at a slightly outer side of the outer end portion) of the turntable 2.

As shown in FIG. 1, the bottom portion 14 of the vacuum chamber 10 closer to the rotation center than the space where the heater unit 7 is positioned protrudes upward to be close to the core unit 21 to form a protruded portion 12a. There is provided a small space between the protruded portion 12a and the core unit 21. Further, there is provided a small space between an inner peripheral surface of the bottom portion 14 and the rotary shaft 22 to be in communication with the case body 20. A purge gas supplying pipe 72 which supplies $N_2$ gas as the purge gas to the small space for purging is provided in the case body 20. The bottom portion 14 of the vacuum chamber 10 is provided with plural purge gas supplying pipes 73 (only one of the purge gas supplying pipes 73 is shown in FIG. 5) which are provided with a predetermined angle interval in the circumferential direction below the heater unit 7 for purging the space where the heater unit 7 is provided. Further, a cover member 7a is provided between the heater unit 7 and the turntable 2 to prevent the gas from being introduced into the space where the heater unit 7 is provided. The cover member 7a is provided to extend from an inner peripheral wall (upper surface of the inner member 71a) of the outer member 71b to an upper end portion of the protruded portion 12a in the circumferential direction. The cover member 7a may be made of quartz, for example.

The film deposition apparatus 1 further includes a separation gas supplying pipe 51 which is connected to a center portion of the ceiling plate 11 of the vacuum chamber 10 and provided to supply $N_2$ gas as the separation gas to the space 52 between the ceiling plate 11 and the core unit 21. The separation gas supplied to the space 52 flows through a small space between the inner protruding portion 5 and the turntable 2 to flow along a front surface of the turntable 2 where the wafers W are to be mounted to be discharged from an outer periphery. The space 50 is kept at a pressure higher those of the space 481 and the space 482 by the separation gas. Thus, the mixing of the Si containing gas supplied to the first process area P1 and the oxidation gas supplied to the second process area P2 by flowing through the center area C can be prevented by the space 50. It means that the space 50 (or the center area C) can function similarly as the separation space H (or the separation area D).

Further, as shown in FIG. 2 and FIG. 3, a transfer port 15 is provided at a side wall of the vacuum chamber 10 for allowing the wafers W, which are substrates, to pass between an external transfer arm 9 and the turntable 2. The transfer port 15 is opened and closed by a gate valve (not shown in the drawings). Further, lift pins, which penetrate the concave portion 24 to lift up the respective wafer W from a backside surface, and a lifting mechanism for the lift pins (both are not shown in the drawings) are provided at a respective portion below the turntable 2. Thus, the respective wafer W is passed between the external transfer arm 9 and the concave portion 24 of the turntable 2, which is a mounting portion, at a place facing the transfer port 15.

Figure 6:
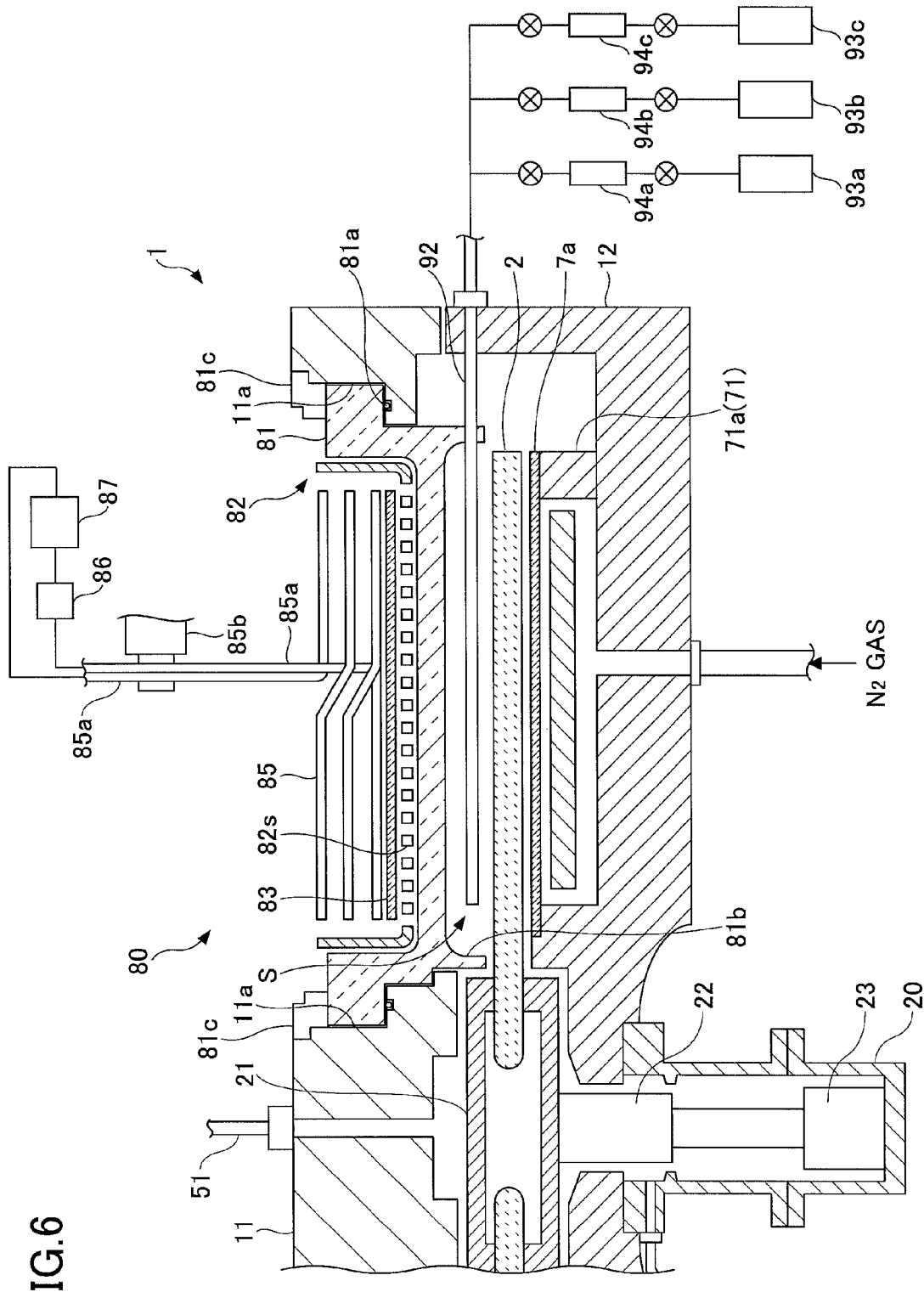
FIG. 6 is a schematic cross-sectional view of an example of a plasma generating device provided in the film deposition apparatus shown in FIG. 1.
Figure 7:
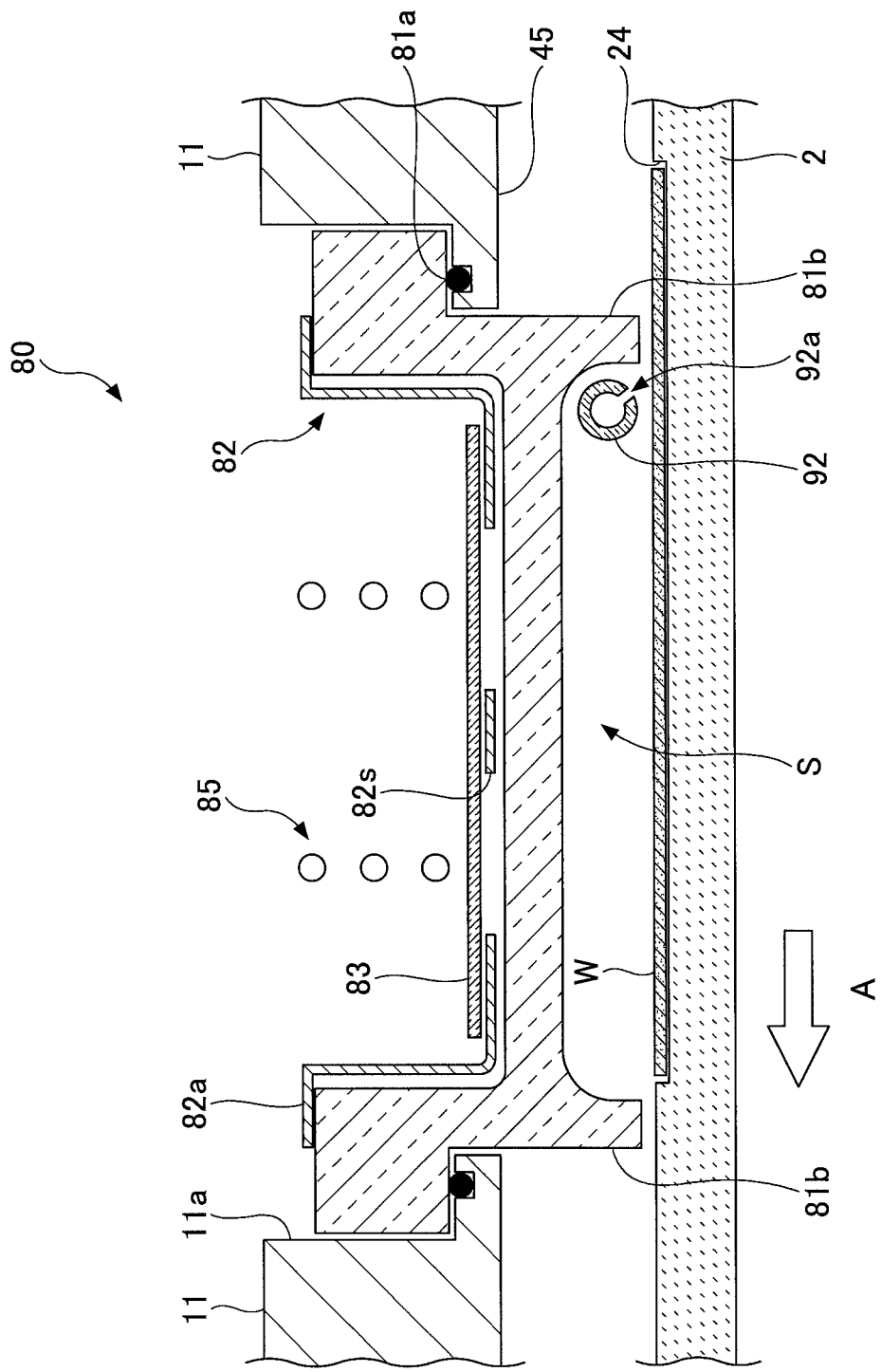
FIG. 7 is another schematic cross-sectional view of the plasma generating device shown in FIG. 6.
Figure 8:
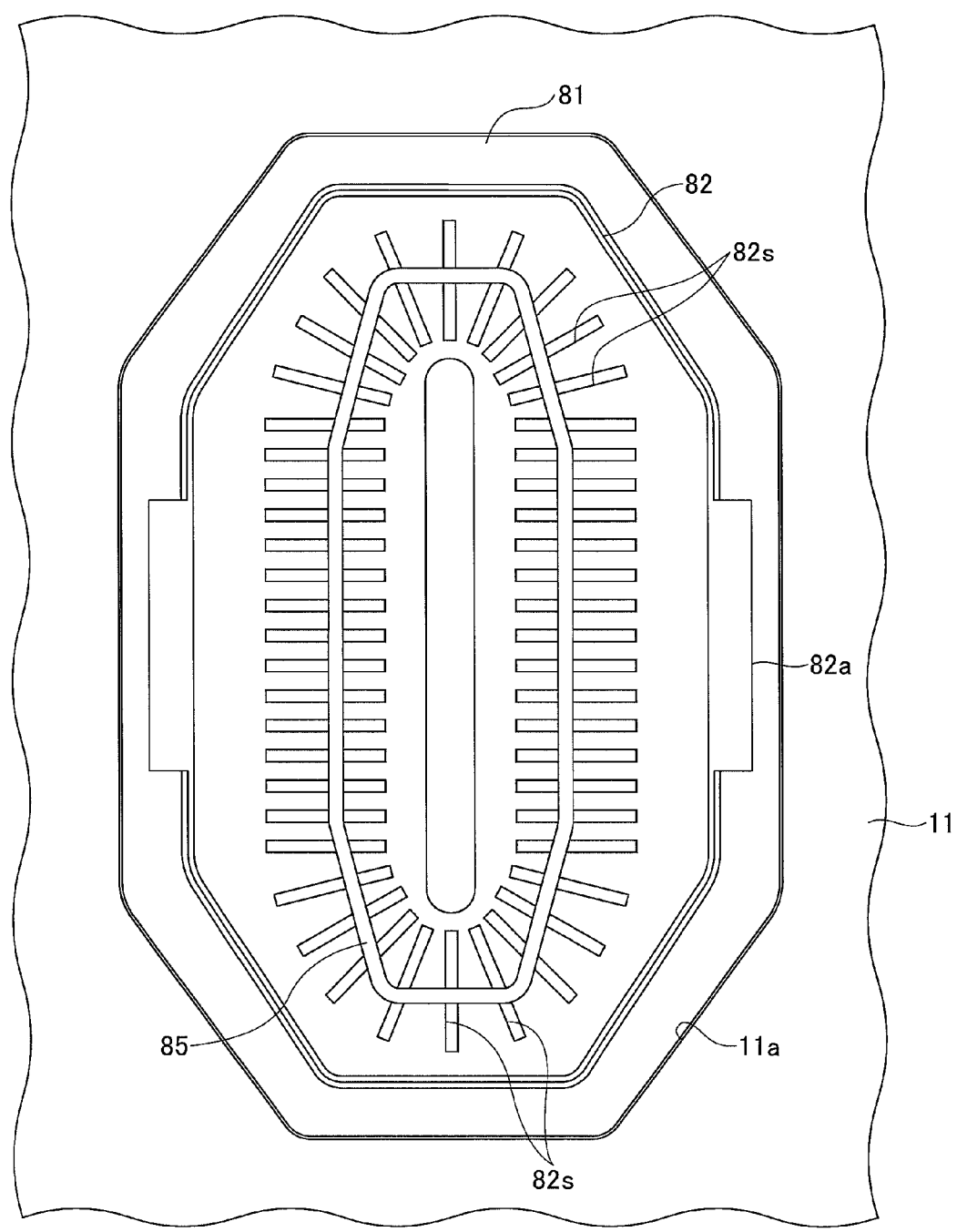
FIG. 8 is a schematic top view of the plasma generating device shown in FIG. 6.

Next, the plasma generating device 80 is explained with reference to FIG. 6 to FIG. 8. FIG. 6 is a schematic cross-sectional view of the plasma generating device 80 taken along the radius direction of the turntable 2. FIG. 7 is a schematic cross-sectional view of the plasma generating device 80 taken along a direction perpendicular to the radius direction of the turntable 2. FIG. 8 is a schematic top view showing the plasma generating device 80. For an explanatory purpose, parts of the components are not shown in the drawings.

Referring to FIG. 6, the plasma generating device 80 is made of a material which is permeable to high frequency waves, and is provided with a concave portion in its upper surface. The plasma generating device 80 further includes a frame member 81 which is embedded in an open portion 11a provided in the ceiling plate 11, a Faraday shield plate 82 housed in the concave portion of the frame member 81 and has substantially a box shape whose top is opened, an insulating plate 83 placed on a bottom surface of the Faraday shield plate 82, and a coil antenna 85 supported above the insulating plate 83. The antenna 85 has substantially an octagonal upper plane shape.

The open portion 11a of the ceiling plate 11 is formed to have plural step portions, and one of the step portions is provided with a groove portion to extend along the perimeter where a sealing member 81a such as an O-ring or the like is embedded. The frame member 81 is formed to have plural step portions which correspond to the step portions of the open portion 11a, and when the frame member 81 is engaged in the open portion 11a, a back side surface of one of the step portions contacts the sealing member 81a embedded in the open portion 11a so that the ceiling plate 11 and the frame member 81 are kept in an air-tight manner.

Further, as shown in FIG. 6, a pushing member 81c, which extends along the outer peripheral of the frame member 8 which is embedded in the open portion 11a of the ceiling plate 11, is provided so that the frame member 81 is pushed downward with respect to the ceiling plate 11. With this, the ceiling plate 11 and the frame member 81 are further kept in an air-tight manner.

The lower surface of the frame member 81 is positioned to face the turntable 2 in the vacuum chamber 10 and a projection portion 81b which projects downward (toward the turntable 2) is provided at the perimeter at the lower surface. The lower surface of the projection portion 81b is close to the surface of the turntable 2 and a space (hereinafter referred to as an inner space S) is provided by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 with respect to the upper surface of the turntable 2 in the separation space H (FIG. 4).

Further, a gas introduction nozzle 92 which penetrates the projection portion 81b is provided in the inner space S. In this embodiment, as shown in FIG. 6, an argon gas supplying source 93a filled with argon (Ar) gas, an oxygen gas supplying source 93b filled with oxygen ($O_2$) gas and an ammonia gas supplying source 93c filled with ammonia ($NH_3$) gas are connected to the gas introduction nozzle 92. The Ar gas, the $O_2$ gas, and the $NH_3$ gas which are flow controlled by flow controllers 94a, 94b, and 94c are supplied from the argon gas supplying source 93a, the oxygen gas supplying source 93b, and the ammonia gas supplying source 93c, respectively, with a predetermined flow rate ratio (mixed ratio) to the inner space S.

The gas introduction nozzle 92 is provided with plural gas discharge holes 92a formed along the longitudinal direction thereof with a predetermined interval (10 mm, for example) so that the Ar gas and the like is discharged from the gas discharge holes 92a.

As shown in FIG. 7, the gas discharge holes 92a are provided to be inclined from a vertical direction with respect to the turntable 2 toward the upstream rotation direction of the turntable 2. Thus, the gas supplied from the gas introduction nozzle 92 is discharged in a direction opposite to the rotation direction of the turntable 2, specifically, toward a space between a lower surface of the projection portion 81b and the surface of the turntable 2. With this, the flows of the reaction gas and the separation gas from a space below the ceiling surface 45 which is upstream of the plasma generating device 80 toward the inner space S along the rotation direction of the turntable 2 can be prevented. Further, as described above, as the projection portion 81b which is formed along an outer periphery of the lower surface of the frame member 81 is close to the surface of the turntable 2, the pressure in the inner space S can be kept high by the gas from the gas introduction nozzle 92. With this as well, the flows of the reaction gas and the separation gas toward the inner space S can be prevented.

The Faraday shield plate 82 is made of a conductive material such as a metal and is grounded, although not shown in the drawings. As clearly shown in FIG. 8, the Faraday shield plate 82 is provided with plural slits 82s at its bottom portion. Each of the slits 82s are extending to be in substantially perpendicular relationship with the corresponding lines of the antenna 85 which has the substantially octagonal plane shape.

As shown in FIG. 7 and FIG. 8, the Faraday shield plate 82 includes two support portions 82a which are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 and the antenna 85 while passing the high frequency wave radiated from the antenna 85.

The antenna 85 is formed by winding a pipe made of copper three times, for example, in a substantially octagonal plane shape. With this structure, cooling water can be circulated in the pipe and the antenna 85 is prevented from being heated to be a high temperature by the high frequency wave provided to the antenna 85. The antenna 85 is provided with a standing portion 85a to which a support portion 85b is attached. The antenna 85 is maintained at a predetermined position in the Faraday shield plate 82 by the support portion 85b. The high frequency power source 87 is connected to the support portion 85b via the matching box 86. The high frequency power source 87 is capable of generating high frequency waves of 13.56 MHz, for example.

According to the plasma generating device 80 thus structured, when the high frequency waves are supplied to the antenna 85 from the high frequency power source 87 via the matching box 86, the electromagnetic field is generated by the antenna 85. In the electromagnetic field, the electric field component is shielded by the Faraday shield plate 82 so is not transmitted downward. On the other hand, the magnetic field component is transmitted within the inner space S via the plural slits 82s of the Faraday shield plate 82. Plasma is generated by the gasses such as the Ar gas, the $O_2$ gas, the $NH_3$ gas and the like which are supplied to the inner space S with a predetermined flow rate ratio (mixed ratio) from the gas introduction nozzle 92 by the magnetic field component. By such plasma, damage to a thin film formed on a wafer W, or to the components in the vacuum chamber 10 can be reduced.

As shown in FIG. 1, the film deposition apparatus 1 of the embodiment further includes a control unit 100 which controls the entirety of the film deposition apparatus 1 and a storing unit 101. The control unit 100 may be a computer. The storing unit 101 stores a program by which the film deposition apparatus 1 executes the film deposition method (as will be explained later) under a control of the control unit 100. The program is formed to include steps capable of executing the film deposition method. The storing unit 101 may be a hard disk or the like, for example. The program stored in the storing unit 101 may be previously stored in a recording medium 102 such as a compact disk (CD), a magneto-optic disk, a memory card, a flexible disk, or the like and may be installed in the storing unit 101 using a predetermined reading device.

(Film Deposition Method)

Next, the film deposition method of the embodiment using the film deposition apparatus 1 is explained as an example.

Figure 9:
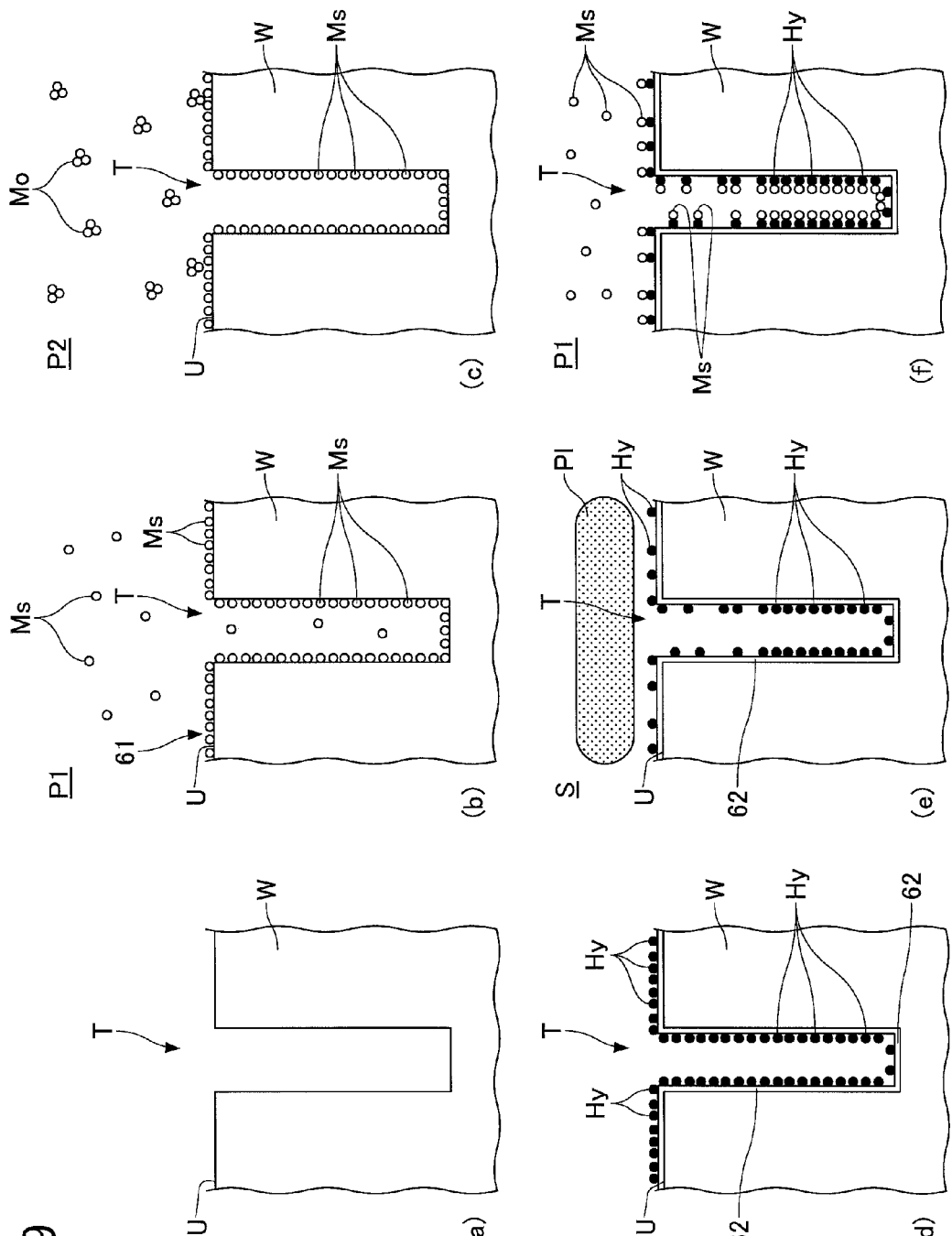
FIG. 9 is a schematic cross-sectional view for explaining an example of a film deposition method of the embodiment.

In this embodiment, a silicon wafer is used as the wafer W and the silicon wafer is provided with a trench T (concave portion) as shown in (a) of FIG. 9.

Further, in the film deposition apparatus 1, it is assumed that the organo-aminosilane gas is supplied from the reaction gas nozzle 31, the $O_3$ gas as the oxidation gas (oxygen containing gas) is supplied from the reaction gas nozzle 32, and a mixture gas (oxygen containing gas, hereinafter referred to as "Ar/$O_2$ gas") of the Ar gas and the $O_2$ gas is supplied from the gas introduction nozzle 92.

First, a gate valve (not shown in the drawings) is opened and the wafer W is passed to the concave portion 24 of the turntable 2 via the transfer port 15 (FIG. 2 and FIG. 3) by the transfer arm 9 (FIG. 3) from outside. This operation is performed by lifting the lift pins (not shown in the drawings) via through holes provided at a bottom surface of the concave portion 24 from the bottom portion side of the vacuum chamber 10 when the concave portion 24 stops at a position facing the transfer port 15. By repeating this operation while intermittently rotating the turntable 2, the wafers W are mounted within the concave portions 24, respectively.

Then, the gate valve is closed, and the vacuum chamber 10 is evacuated by the vacuum pump 640 to the minimum vacuum level. Then, the $N_2$ gas as the separation gas is discharged from the separation gas nozzles 41 and 42 at a predetermined flow rate. At this time, the $N_2$ gas is also discharged from the separation gas supplying pipe 51 and the purge gas supplying pipes 72 and 73 at a predetermined flow rate, respectively. With this, the vacuum chamber 10 is adjusted to a predetermined set pressure by the pressure regulator 650 (FIG. 1). Then, the wafers W are heated to 450° C., for example, by the heater unit 7 while rotating the turntable 2 in a clockwise direction at a rotational speed of 20 rpm, for example.

Subsequently, the organo-aminosilane gas is supplied from the reaction gas nozzle 31 (FIG. 2 and FIG. 3), and the $O_3$ gas is supplied from the reaction gas nozzle 32. Further, the Ar/$O_2$ gas is supplied from the gas introduction nozzle 92, and high frequency waves of 13.56 MHz with an output power of 1400 W, for example, are provided to the antenna 85 of the plasma generating device 80. With this, the oxygen plasma is generated in the inner space S between the plasma generating device (FIG. 6) and the turntable 2. The oxygen plasma includes active species such as oxygen ions, oxygen radicals or the like, or high energy particles.

By the rotation of the turntable 2, the wafer W repeatedly passes the first process area P1, the separation area H (D), the second process area P2, (the lower area of) the inner space S, and the separation area H (D) in this order (see FIG. 3).

In the first process area P1, as shown in (b) of FIG. 9, molecules Ms of the organo-aminosilane gas are adsorbed onto the surface U of the wafer W and the inner surface of the trench T to form a molecular layer 61 of the organo-aminosilane. After passing through the separation area H, in the second process area P2, as shown in (c) of FIG. 9, the organo-aminosilane gas adsorbed onto the surface U of the wafer W and the inner surface of the trench T is oxidized by the $O_3$ gas molecules Mo so that a silicon oxide film 62 is formed along the inner surface of the trench T as shown in (d) of FIG. 9. When the organo-aminosilane gas is oxidized, OH radicals Hy are formed as a by-product. The generated OH radicals Hy are adsorbed onto the surface of the silicon oxide film 62.

Subsequently, when the wafer W reaches the inner space S of the plasma generating device 80, the wafer W is exposed to the oxygen plasma P1 as shown in (e) of FIG. 9. At this time, a part of the OH radicals Hy adsorbed onto the silicon oxide film 62 is eliminated from the silicon oxide film 62 by the collision of the high energy particles, for example, in the oxygen plasma P1. The oxygen plasma P1 reaches the surface U of the wafer W and near the aperture of the trench T, however, hardly reaches near the bottom portion of the trench T. Thus, a relatively large amount of the OH radicals Hy are eliminated from the surface U of the wafer W and the side surface of the trench T near the aperture. As a result, as shown in (e) of FIG. 9, the OH radicals Hy are distributed such that the density of the OH radicals Hy becomes high at the bottom portion and the side surface near the bottom portion of the trench T, and then becomes lower toward the aperture of the trench T and the surface U of the wafer W.

Subsequently, when the wafer W moves back to the first process area P1 by the rotation of the turntable 2, the molecules Ms of the organo-aminosilane gas supplied from the reaction gas nozzle 31 are adsorbed onto the surface U of the wafer W and the inner surface of the trench T. At this time, as the molecules Ms of the organo-aminosilane gas tend to easily be adsorbed onto the OH radicals Hy (Patent Document 2), as shown in (f) of FIG. 9, the distribution of the molecules Ms of the organo-aminosilane gas adsorbed onto the surface U of the wafer W and the inner surface of the trench T becomes corresponding to the distribution of the OH radicals Hy. It means that the molecules Ms of the organo-aminosilane gas are distributed in the inner surface of the trench T such that the density at the bottom portion and the side surface near the bottom portion of the trench T becomes high and the density becomes lower closer to the aperture of the trench T.

Subsequently, when the wafer W passes through the second process area P2, the organo-aminosilane gas adsorbed onto the surface U of the wafer W and the inner surface of the trench T is oxidized by the $O_3$ gas and a silicon oxide film 62 is further formed as shown in (a) of FIG. 10. Here, the thickness distribution of the silicon oxide film 62 reflects the density of the organo-aminosilane gas adsorbed on the inner surface of the trench T. Thus, the silicon oxide film 62 becomes thicker at the bottom portion and the side surface near the bottom portion of the trench T and becomes thinner toward the aperture of the trench T. Then, the OH radicals generated by the oxidization of the organo-aminosilane gas are adsorbed onto the surface of the silicon oxide film 62.

Subsequently, when the wafer W moves back to the inner space S of the plasma generating device 80, as described above, the OH radicals are distributed such that the density of the OH radicals becomes high at the bottom portion and the side surface near the bottom portion of the trench T and becomes lower toward the aperture of the trench T.

Figure 10:
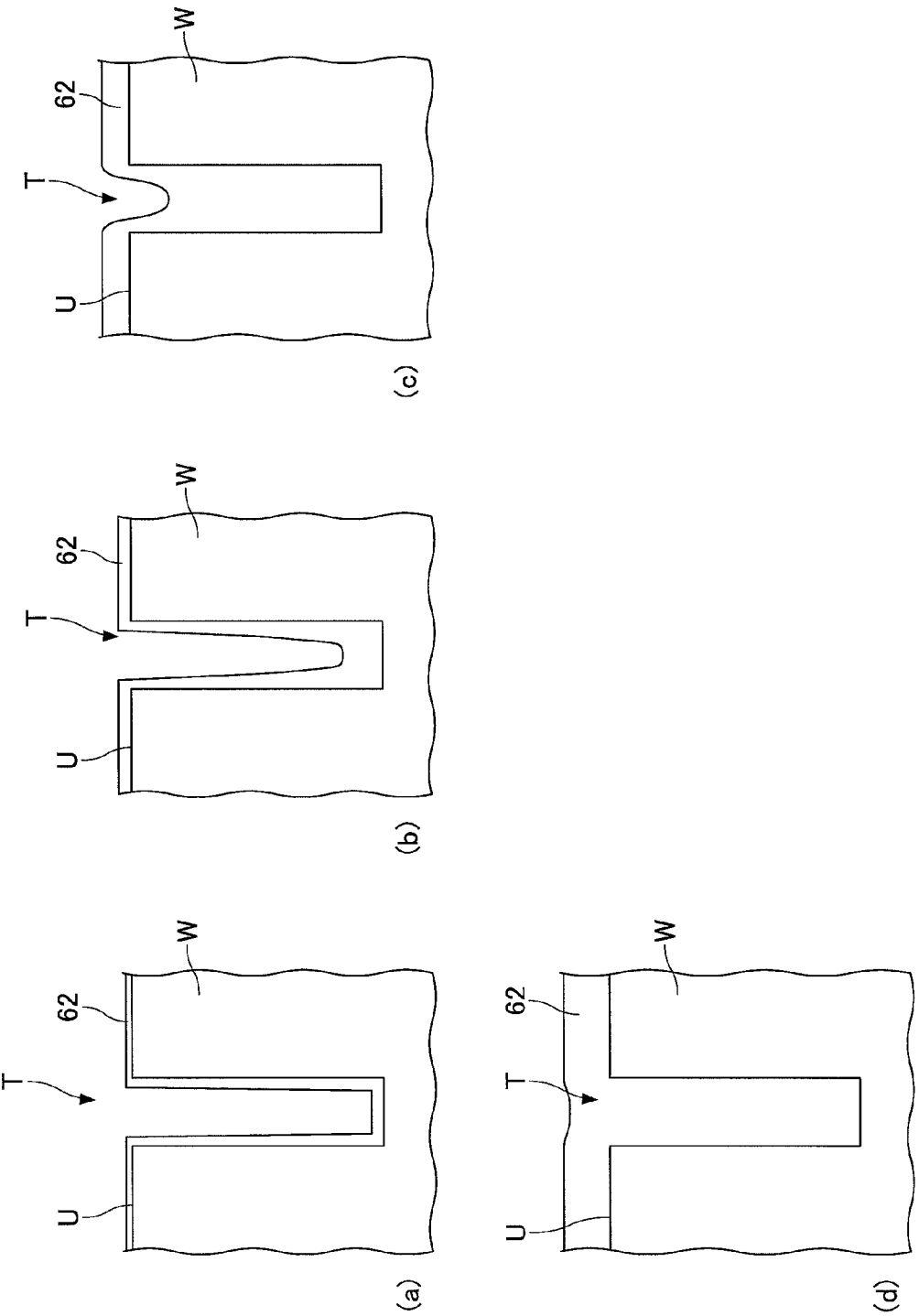
FIG. 10 is a schematic cross-sectional view for explaining the example of the film deposition method of the embodiment.

Then, when the above process is repeated, the silicon oxide film 62 is formed such that it becomes thicker at the bottom portion of the trench T, as shown in (b) of FIG. 10. When the silicon oxide film 62 becomes further thicker, the trench T is filled with the silicon oxide film 62 without a void, as shown in (c) of FIG. 10, and then, the filling of the trench T is completed as shown in (d) of FIG. 10.

As described above, according to the film deposition method of the embodiment, the OH radicals generated by the oxidization of the organo-aminosilane gas and adsorbed onto the silicon oxide film 62 are distributed such that the density becomes high at the bottom portion and the side surface near the bottom portion of the trench T and becomes lower toward the aperture of the trench T due to the oxygen plasma generated by the plasma generating device 80. The OH radicals function as adsorbing sites of the organo-aminosilane gas and the organo-aminosilane gas is adsorbed in accordance with the distribution of the OH radicals. Thus, the organo-aminosilane gas is also distributed such that the density becomes high at the bottom portion and the side surface near the bottom portion of the trench T and becomes lower toward the aperture of the trench T. Therefore, the silicon oxide film 62 is formed to be thicker at the bottom portion and the side surface near the bottom portion of the trench T and becomes thinner toward the aperture of the trench T.

When filling a trench with silicon oxide or the like using a general-purpose CVD or ALD process, the precursor reacts within the gas phase or is adsorbed onto the side surface of the trench before being diffused to the bottom portion of the trench so that the thickness becomes greater in the trench near the aperture. Thus, the aperture is blocked by the deposited film while a void remains within the trench. Compared with this, the film deposition method of the embodiment has advantages.

ALTERNATIVE EXAMPLE 1

In the above film deposition method, the oxygen plasma may be generated while supplying hydrogen containing gas from the gas introduction nozzle 92 in addition to the $Ar/O_2$ gas.

Figure 11:
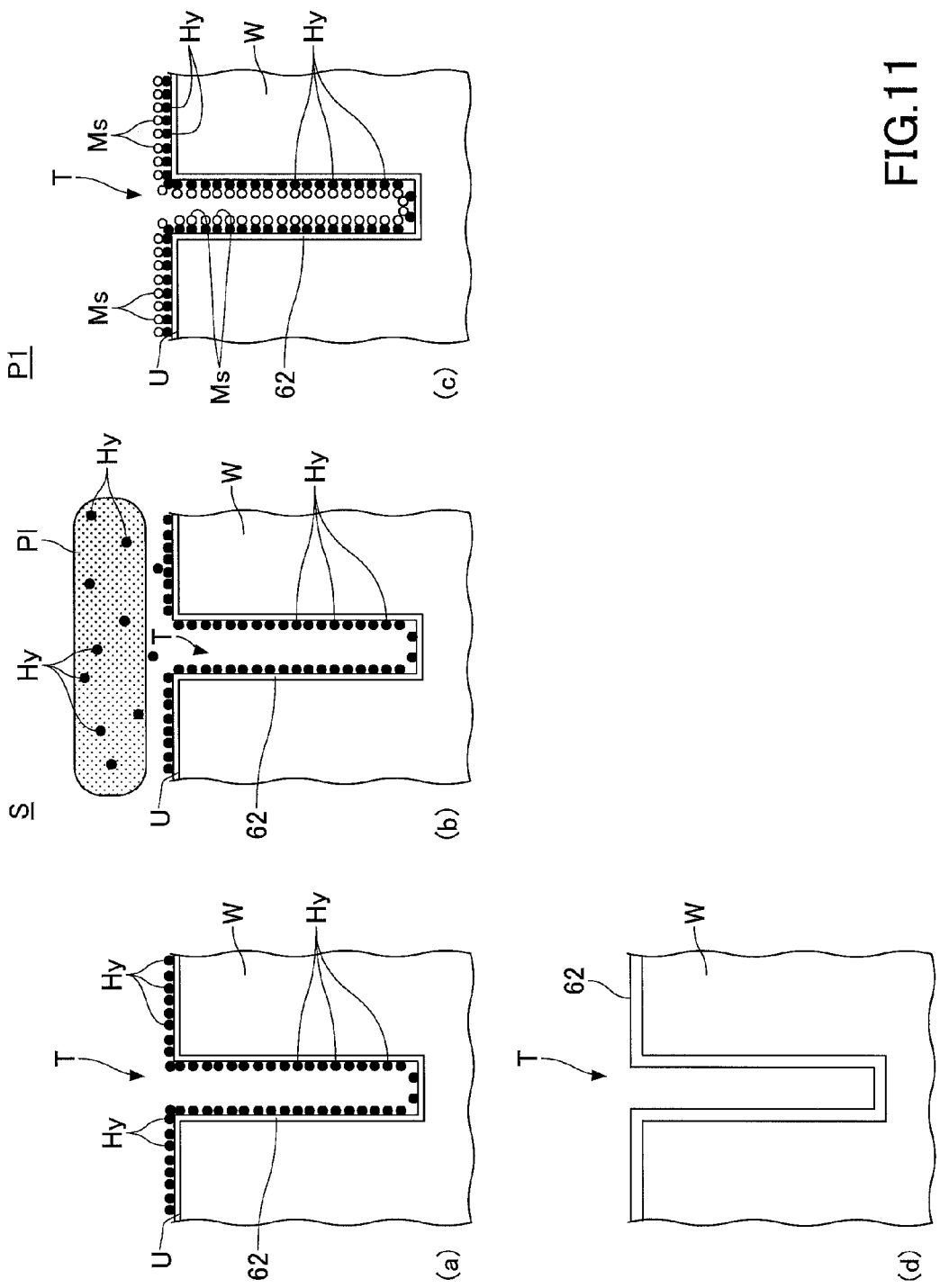
FIG. 11 is a schematic cross-sectional view for explaining another example of the film deposition method of the embodiment.

After the wafer W passes through the first process area P1, the separation area H, and the second process area P2, as shown in (a) of FIG. 11, the silicon oxide film 62 is formed on the surface U of the wafer W and the inner surface of the trench T, and the OH radicals Hy are formed on the surface of the silicon oxide film 62.

Then, the wafer W reaches the inner space S and the wafer W is exposed to the oxygen plasma P1. At this time, as shown in (b) of FIG. 11, the oxygen plasma P1 includes the OH radicals Hy generated from the hydrogen containing gas. Thus, even if the OH radicals Hy adsorbed onto the silicon oxide film 62 are eliminated by the oxygen plasma P1, the OH radicals Hy generated from the oxygen plasma P1 may be adsorbed onto the silicon oxide film 62. Thus, compared with a case where only the $Ar/O_2$ gas is supplied as explained above with reference to (e) of FIG. 9, the elimination of the OH radicals Hy from the surface U of the wafer W and the inner surface of the trench T near the aperture can be suppressed so that the distribution of the OH radicals Hy becomes uniform on the inner surface of the trench T.

Thus, when the wafer W moves back to the first process area P, as shown in (c) of FIG. 11, the molecules Ms of the organo-aminosilane gas from the reaction gas nozzle 31 are also uniformly adsorbed onto the inner surface of the trench T. Thus, as shown in (d) of FIG. 11, the silicon oxide film 62, which is formed by oxidizing the organo-aminosilane gas adsorbed on the inner surface of the trench T by the $O_3$ gas, can also be uniformly formed.

Here, as the distribution of the OH radicals Hy on the inner surface of the trench T (especially near the aperture) can be controlled by controlling the flow rate of the hydrogen containing gas and/or the high frequency power, the thickness distribution of the silicon oxide film formed on the inner surface of the trench T can also be controlled.

ALTERNATIVE EXAMPLE 2

Further, the thickness distribution of the silicon oxide film in the trench can also be controlled by controlling the rotational speed of the turntable 2.

Figure 12:
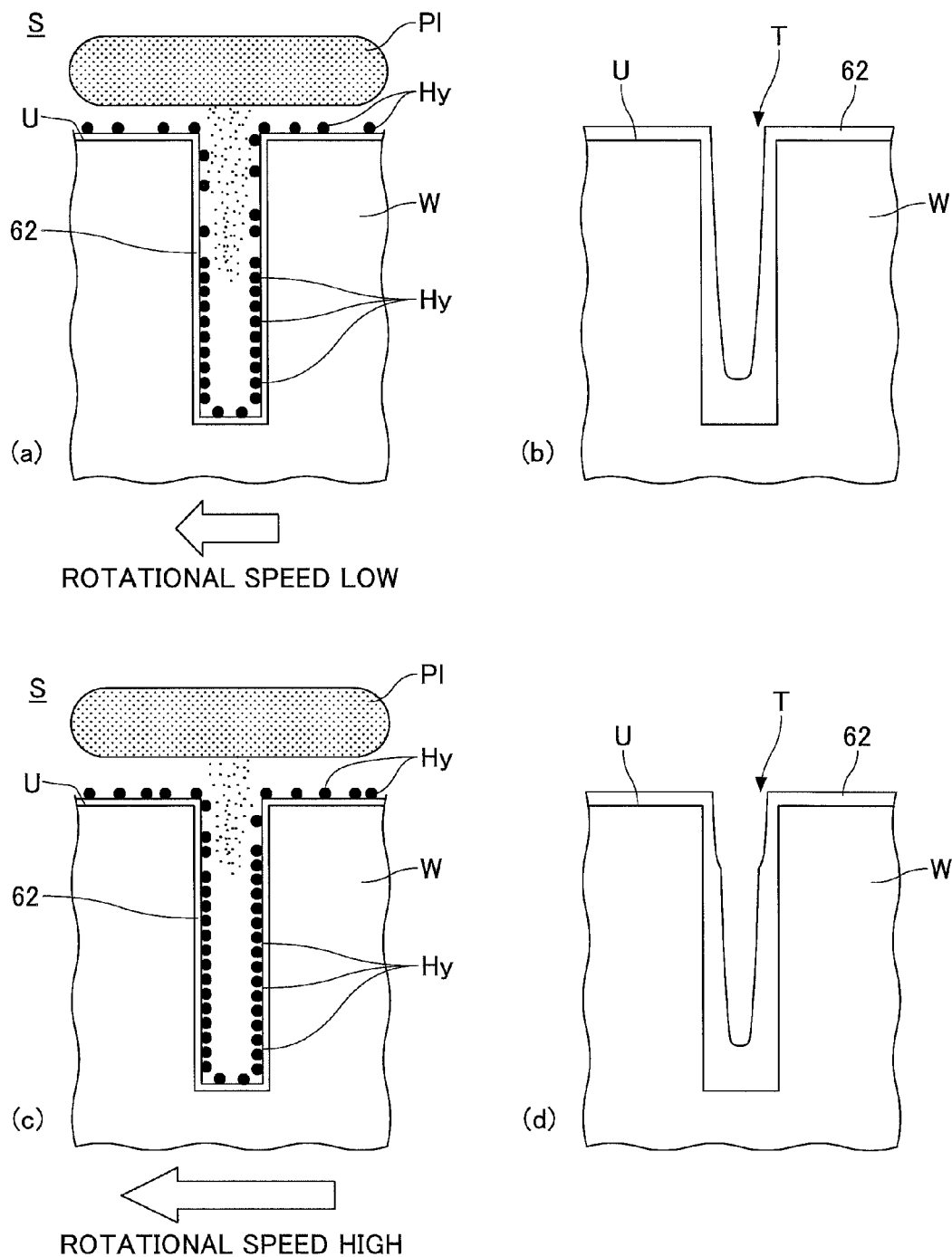
FIG. 12 is a schematic view for explaining another example of a film deposition method of the embodiment.

Parts (a) and (b) of FIG. 12 show an example where the rotational speed of the turntable 2 is relatively low, and (c) and (d) of FIG. 12 show an example where the rotational speed of the turntable 2 is relatively high.

As shown in (a) of FIG. 12, when the rotational speed is relatively slow, a period in which the wafer W exists at the inner space S below the plasma generating device 80 becomes long. It means that a period in which the wafer W is exposed to the oxygen plasma becomes long. Therefore, the oxygen plasma P1 can reach a deeper side at the bottom portion of the trench T. Thus, when the oxygen plasma P1 is generated from the $Ar/O_2$ gas (where the OH radicals are generated in the oxygen plasma P1), for example, the density of the OH radicals Hy tends to become lower at the bottom portion of the trench T as well. In other words, an area where the density of the OH radicals Hy becomes low spreads toward a bottom surface side. As a result, as shown in (b) of FIG. 12, an area where the silicon oxide film 62 formed on the inner surface of the trench T becomes thinner spreads toward the bottom portion side of the trench T. However, at this time, a period in which the organo-aminosilane gas is supplied to the wafer W also becomes long. Thus, the organo-aminosilane gas supplied in the first process area P1 tends to easily spread to the bottom portion of the trench T.

On the other hand, when the rotational speed is made faster, the wafer W passes through the inner space S below the plasma generating device 80 within a short period. It means that a period in which the wafer W is exposed to the oxygen plasma becomes short. Therefore, the oxygen plasma P1 hardly diffuses to the bottom portion of the trench T. Thus, as shown in (c) of FIG. 12, the OH radicals Hy are eliminated only at a part near the aperture of the trench T and the density of the OH radicals Hy at the part becomes low. As a result, as shown in (d) of FIG. 12, the silicon oxide film 62 becomes thinner at the part near the aperture of the trench T and becomes relatively thick at a lower part near the bottom surface side.

On the other hand, when the rotational speed becomes faster, a period in which the organo-aminosilane gas is supplied to the wafer W becomes short. Thus, the organo-aminosilane gas supplied at the first process area P1 hardly diffuses to the bottom portion of the trench T and the amount of the organo-aminosilane gas which is adsorbed onto the OH radicals Hy becomes low. Therefore, the silicon oxide film at the bottom surface side becomes thin.

It means that conflicting advantages can be obtained by the rotational speed of the turntable 2.

Here, by significantly effecting one of the advantages, the thickness of the silicon oxide film 62 at the bottom portion of the trench T can be controlled. For example, when the flow rate of the organo-aminosilane gas is high enough, the amount of the organo-aminosilane gas which diffuses to the bottom portion of the trench T can be maintained, thus, the thickness distribution of the silicon oxide film depends on the distribution of the OH radicals. Thus, the silicon oxide film at the bottom surface side of the trench can be made thicker, for example.

ALTERNATIVE EXAMPLE 3

Further, as can be understood from the above explanation, the thickness distribution of the silicon oxide film can be controlled by controlling the supplying amount (flow rate) of the organo-aminosilane gas supplied from the reaction gas nozzle 31.

Figure 13:
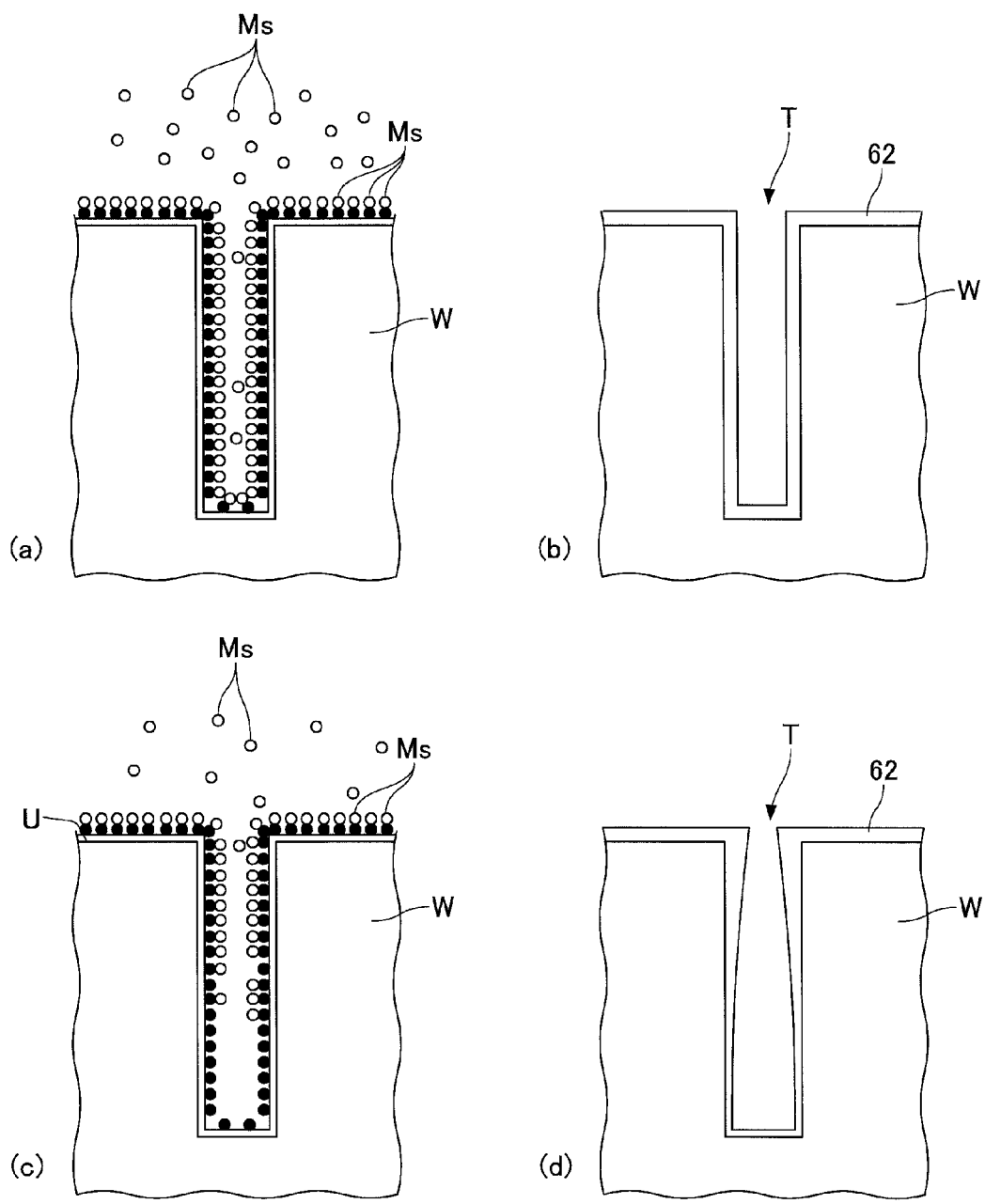
FIG. 13 is a schematic view for explaining another example of the film deposition method of the embodiment.

Parts (a) and (b) of FIG. 13 show an example where the flow rate of the organo-aminosilane gas is relatively high, and (c) and (d) of FIG. 13 show an example where the flow rate of the organo-aminosilane gas is relatively low.

For example, when uniformly distributing the OH radicals Hy on the inner surface of the trench T as described in the alternative example 1, while the flow rate of the organo-aminosilane gas is high enough, as shown in (a) of FIG. 13, the organo-aminosilane gas diffuses to the bottom portion of the trench T and is adsorbed onto almost all of the OH radicals Hy. As a result, as shown in (b) of FIG. 13, the thickness distribution of the silicon oxide film in the trench becomes substantially uniform by reflecting the distribution of the adsorbed OH radicals.

On the other hand, when uniformly distributing the OH radicals Hy on the inner surface of the trench T, while the flow rate of the organo-aminosilane gas is not high enough, as shown in (c) of FIG. 13, the amount of the organo-aminosilane gas is not enough to reach the bottom portion of the trench T. Thus, as shown in (d) of FIG. 13, the silicon oxide film is formed to have a thickness which is greater near the aperture than the bottom portion of the trench T.

According to the film deposition method of the embodiment, it is possible to control such that the thickness becomes less at the shallow portion in the trench T while the thickness becomes greater at the deeper portion in the depth direction, or the thickness becomes greater at the shallow portion in the trench T while the thickness becomes less at the deeper portion in the trench T in the depth direction.

ALTERNATIVE EXAMPLE 4

Further, for the alternative example 4 of the film deposition method, a combination of the film deposition method which is explained with reference to FIG. 9 and the alternative example 3 can be adopted. It means that first, by controlling the distribution of the OH radicals Hy adsorbed onto the inner surface of the trench T by the oxygen plasma generated only from the Ar/$O_2$ gas, the silicon oxide film 62 is formed such that the thickness becomes greater at the bottom portion of the trench T and becomes less at the aperture side. With this, the thickness distribution as shown in (a) of FIG. 14 can be obtained when the silicon oxide film 62 is formed to have a desired thickness.

Alternatively, the silicon oxide film 62 is formed such that the thickness becomes reduced at the bottom portion of the trench T and becomes greater at the aperture side by allowing the OH radicals Hy to be uniformly adsorbed onto the inner surface of the trench T due to the oxygen plasma generated from the hydrogen containing gas, for example, in addition to the Ar/$O_2$ gas as well as lowering the flow rate of the organo-aminosilane gas. By this operation, the thickness distribution as shown in (b) of FIG. 14 can be obtained.

Figure 14:
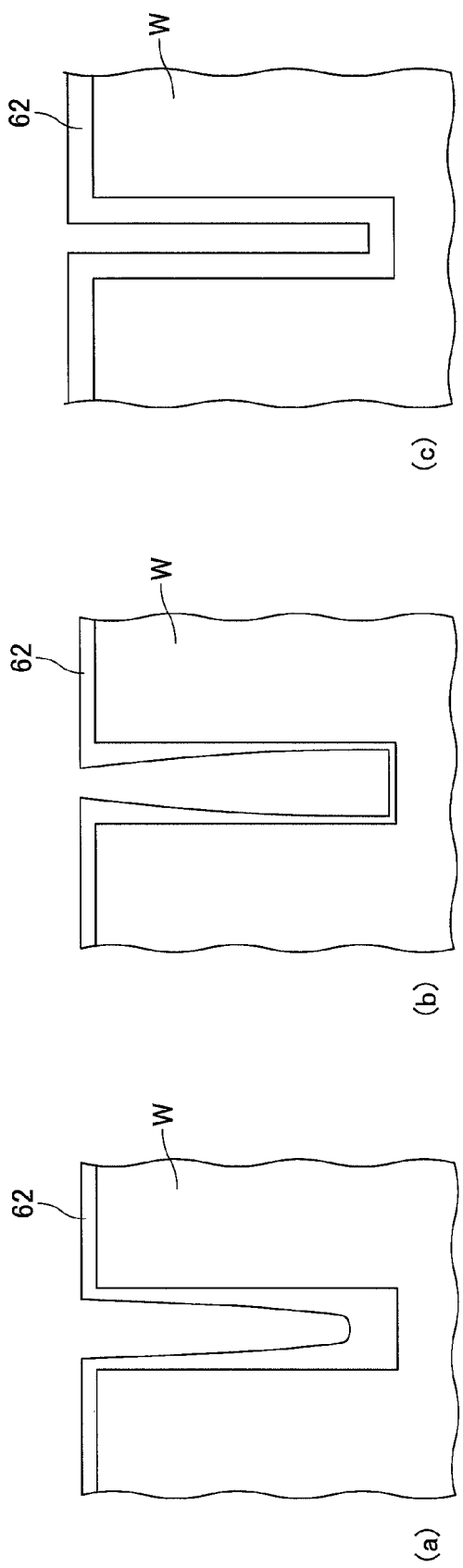
FIG. 14 is a schematic view for explaining another example of the film deposition method of the embodiment.

Thus, in the alternative example 4, the silicon oxide film 62 having substantially a uniform thickness on the inner surface of the trench T as shown in FIG. 14 (c) can be obtained in which the thickness distributions as shown in (a) and (b) of FIG. 14 are combined.

As described above, according to the film deposition method of the embodiments (including the alternative examples 1 to 4), the distribution of the organo-aminosilane gas which is adsorbed onto an inner surface of a trench formed in a wafer W can be controlled by the distribution of the OH radicals which are adsorbed onto the inner surface of the trench; thus the thickness distribution of the silicon oxide film formed on the inner surface of the trench can also be controlled.

The distribution of the OH radicals can be controlled by the high frequency waves provided to the antenna 85 of the plasma generating device 80, the flow rate of the hydrogen containing gas supplied from the gas introduction nozzle 92 to the inner space S, the rotational speed of the turntable 2, and the like. Further, the thickness distribution of the silicon oxide film can further be controlled by controlling the flow rate of the organo-aminosilane gas in addition to controlling the distribution of the OH radicals.

Further, according to the film deposition method of the embodiments (including the alternative examples 1 to 4), as the deposited silicon oxide film is exposed to the oxygen plasma, the water or the organic impurities generated by the decomposition of the organo-aminosilane gas and included in the silicon oxide film can be removed by the oxygen plasma to form the high density silicon oxide film. Further, as the atoms in the silicon oxide film can be rearranged by the impact of the high energy particles in the collisions with oxygen plasma, the film quality may be improved.

As described above, according to the film deposition method of the embodiment, the thickness of the silicon oxide film formed on the inner wall of the trench T can be controlled in accordance with the following mechanism.

When the organo-aminosilane gas (first reaction gas) and the $O_3$ gas (second reaction gas) are supplied onto the wafer W provided with the trench T, a silicon oxide film (a film of a reaction product with a second reaction gas which reacts with the first reaction gas) is formed and OH radicals (hydroxyl radicals) are generated on the surface thereof.

Then, the oxygen plasma is supplied before the organo-aminosilane gas is supplied in the next cycle, and the OH radicals are partially eliminated by the oxygen plasma. At this time, the oxygen plasma hardly reaches the bottom portion of the trench T so that the amount of the OH radicals is not reduced at the bottom portion of the trench T. Therefore, the amount of OH radicals is controlled to be smaller at a shallow portion than at a deeper portion in the trench T.

On the other hand, when the hydrogen containing gas is also supplied with the oxygen plasma, the OH radicals are generated from the hydrogen containing gas. Thus, elimination of the OH radicals near the aperture of the trench T can be reduced and the distribution of the OH radicals becomes uniform in the trench.

Further, when the rotational speed of the wafer is increased, the oxygen plasma hardly reaches the bottom portion of the trench T so that the amount of the OH radicals is controlled to be smaller at a shallow portion than that at a deeper portion in the trench T.

On the other hand, when the rotational speed of the wafer W is reduced, the oxygen plasma reaches deeper inside the bottom portion of the trench T so that the amount of the OH radicals in the trench is reduced.

As described above, the adsorption distribution of the OH radicals in the depth direction of the trench T can be controlled by controlling the flow rate of the oxygen plasma (including controlling the high frequency power), controlling the supplying of the hydrogen containing gas (including controlling the flow rate of the hydrogen containing gas), or controlling the rotational speed of the wafer W (including controlling the period in which the wafer W is exposed to the oxygen plasma). Here, as described above, the organo-aminosilane gas tends to be adsorbed onto the OH radicals. Thus, the thickness of the silicon oxide film generated by the organo-aminosilane gas can be controlled in accordance with the adsorption distribution of the OH radicals in the depth direction of the trench T.

Further, the thickness of the silicon oxide film generated by the organo-aminosilane gas can be controlled by controlling the flow rate of the organo-aminosilane gas, or controlling the rotational speed of the wafer W (including controlling the period in which the organo-aminosilane gas is supplied to the wafer W).

Examples are explained.

EXAMPLE 1

In this example, an influence on the thickness distribution of the silicon oxide film formed in a hole h formed in a silicon wafer (the diameter of which is 300 mm) by the high frequency power generating the plasma, the flow rate of the ammonia gas ($NH_3$) as the hydrogen containing gas, the flow rate of the organo-aminosilane gas, and the rotational speed of the turntable 2 is examined.

Figure 15:
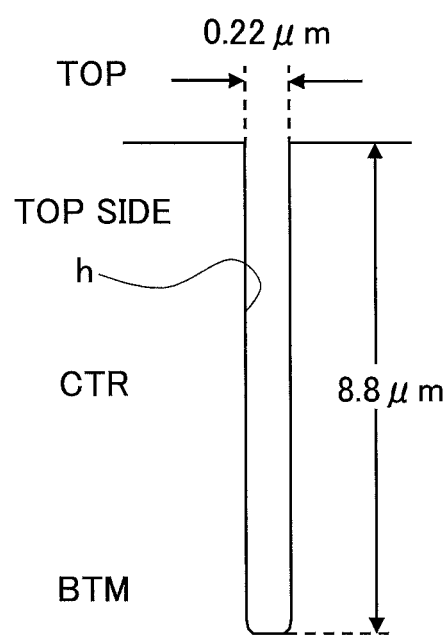
FIG. 15 is a schematic cross-sectional view showing a hole formed in a wafer for an example.

As shown in FIG. 15, the hole h has a column shape whose inner diameter is about 0.22 μm and depth is about 8.8 μm where the aspect ratio (depth/(inner diameter)) is 40. Further in FIG. 15, measured positions are shown for which the thickness of the silicon oxide film is measured by a scanning electron microscope (SEM) in this example. The thickness of the silicon oxide film is measured at four points including a point (TOP) in the vicinity of the hole h at the surface of the silicon wafer, a point (TOP side) on a side surface of the hole h near the aperture, a point (CTR) in the middle of the hole h in the depth direction, and a point (BTM) on the side surface of the hole h near the bottom surface. In the following, the thicknesses of the TOP side, the CTR, and the BTM are normalized by the thickness at the TOP (it is expressed as 100% when the thickness is equal to the thickness at the TOP). Further, the deposition rate is obtained by measuring the thickness at the center of the silicon wafer in addition to the thickness in the hole h. Here, the targeted thickness is adjusted to be a thickness not to fill the hole h. Further, in this example, the above described film deposition apparatus 1 is used.

(1) Dependency on High Frequency Power

Figure 16:
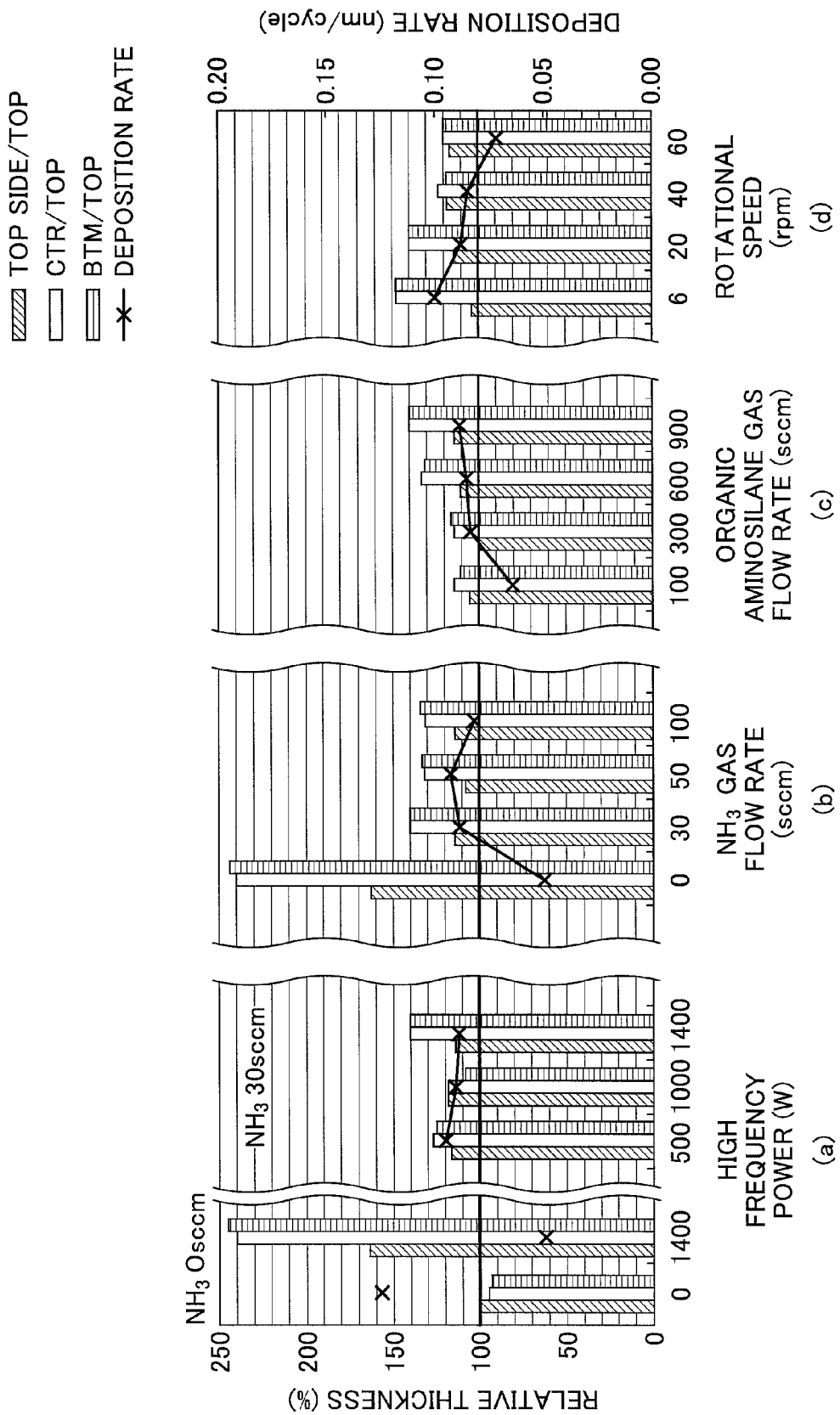
FIG. 16 is view showing a result of an example.

Part (a) of FIG. 16 shows a relationship between the thickness distribution of the silicon oxide film deposited in the hole h and the high frequency power. The conditions other than the high frequency power are as follows.

the flow rate of the organo-aminosilane gas from the reaction gas nozzle 31: 900 sccm the flow rate of the ozone gas from the reaction gas nozzle 32: 1.8 g/min the rotational speed of the turntable 2: 20 rpm the flow rate of the ammonia gas from the gas introduction nozzle 92: 0 sccm and 30 sccm wafer temperature: 400° C.

The ozone gas is obtained by supplying the oxygen gas at the flow rate of 6 standard liter/min (slm) to a predetermined ozone generator connected to the reaction gas nozzle 32, while generating ozone of 300 g/$Nm^3$ by the ozone generator.

With reference to (a) of FIG. 16, when the silicon oxide film is deposited without supplying the $NH_3$ gas from the gas introduction nozzle 92, if the high frequency power is not applied to the plasma generating device 80, the thickness at the TOP side (the side surface near the aperture) becomes greater than the thickness at the TOP, and the thicknesses at the CTR (near the center of the hole h in the depth direction) and the BTM (the side surface near the bottom surface) become less than that at the TOP. Thus, when the silicon oxide film is further formed by this condition, there is a possibility of the aperture of the hole h becoming blocked by the silicon oxide and a void being generated in the hole h.

On the other hand, when the silicon oxide film is formed without supplying the $NH_3$ gas from the gas introduction nozzle 92, and the high frequency waves of 1400 W are applied to the plasma generating device 80, the thicknesses at any of the TOP side, the CTR, and the BTM become far greater than the thickness at the TOP. Further, the deposition rate of the silicon oxide film (see "x" in FIG. 16 and the axis of ordinates at the right) is greatly lowered compared with a case when the high frequency power is not applied. It can be understood that the OH radicals adsorbed onto the deposited silicon oxide film are eliminated by the oxygen plasma generated by the plasma generating device 80. Further, the thicknesses of the film at the CTR and the BTM are greater than that at the TOP side. It can be understood that a larger amount of OH radicals are eliminated from the TOP and the TOP side.

Further, when the silicon oxide film is deposited while supplying the $NH_3$ gas at 30 sccm from the gas introduction nozzle 92, it can be understood that the deposition rate becomes lower as the high frequency power is increased. It means that the OH radicals adsorbed onto the deposited silicon oxide film are eliminated so that the organo-aminosilane gas tends not to be adsorbed to reduce the deposition rate as the magnitude of the oxygen plasma becomes large. When the high frequency power is 1400 W, the thicknesses at the CTR and the BTM become significantly greater than that at the TOP side.

(Dependency on Flow Rate of $NH_3$ Gas)

Part (b) of FIG. 16 shows a relationship between the thickness distribution of the silicon oxide film deposited in the hole h and the flow rate of the $NH_3$ gas. The conditions other than the flow rate of the $NH_3$ gas are as follows.

the flow rate of the organo-aminosilane gas from the reaction gas nozzle 31: 900 sccm
    the flow rate of the ozone gas from the reaction gas nozzle 32: 1.8 g/min
    the rotational speed of the turntable 2: 20 rpm
    high frequency power: 1400 W
    wafer temperature: 400° C.

With reference to (b) of FIG. 16, when the flow rate of the $NH_3$ gas is increased, the thicknesses at the TOP side, the CTR, and the BTM become relatively less compared with the thickness at the TOP (in other words, the thickness distribution in the hole h becomes uniform). It means that the concentration of the OH radicals generated by the plasma generating device 80 increases in accordance with increasing the flow rate of the $NH_3$ gas so that the elimination of the OH radicals adsorbed onto the silicon oxide film especially at the TOP is suppressed.

(Dependency on Flow Rate of Organo-Aminosilane Gas)

Part (c) of FIG. 16 shows a relationship between the thickness distribution of the silicon oxide film deposited in the hole h and the flow rate of the organo-aminosilane gas. The conditions other than the flow rate of the organo-aminosilane gas are as follows.

the flow rate of the ozone gas from the reaction gas nozzle 32: 1.8 g/min
    the rotational speed of the turntable 2: 20 rpm
    high frequency power: 1400 W
    the flow rate of the $NH_3$ gas: 30 sccm
    wafer temperature: 400° C.

With reference to (c) of FIG. 16, when the flow rate of the organo-aminosilane gas is increased, the deposition rate also increases. Further, it can be understood that the thicknesses at the CTR and the BTM become greater compared with the thickness at the TOP side in accordance with increasing the flow rate of the organo-aminosilane gas. It means that the organo-aminosilane gas sufficiently reaches the bottom surface side of the hole h.

(Dependency on Rotational Speed of Turntable 2)

Part (d) of FIG. 16 shows a relationship between the thickness distribution of the silicon oxide film deposited in the hole h and the rotational speed of the turntable 2. The conditions other than the rotational speed are as follows.

the flow rate of the organo-aminosilane gas from the reaction gas nozzle 31: 900 sccm
    the flow rate of the ozone gas from the reaction gas nozzle 32: 1.8 g/min
    high frequency power: 1400 W
    the flow rate of the $NH_3$ gas: 30 sccm
    wafer temperature: 400° C.

With reference to (d) of FIG. 16, when the rotational speed of the turntable 2 is increased, the film deposition speed decreases. This means that the period in which the silicon wafer is exposed to the organo-aminosilane gas becomes short, and the adsorption amount of the organo-aminosilane gas is reduced. Further, reduced adsorption amount is greater at the bottom surface side of the hole h and the thicknesses at the CTR and the BTM become relatively less compared with the thickness at the TOP side in accordance with increasing the rotational speed. In other words, the distribution of the thickness of the silicon oxide film formed in the hole h is changed from a distribution in which the thickness is less at the aperture side and greater at the bottom surface side to a distribution where the film is uniformly formed inside in accordance with increasing the rotational speed.

As described above, it is confirmed that the thickness distribution of the silicon oxide film deposited in the hole can be arbitrarily controlled by the high frequency power provided via the antenna 85 of the plasma generating device 80, the flow rate of the hydrogen containing gas supplied from the gas introduction nozzle 92 to the inner space S, the rotational speed of the turntable 2, and the flow rate of the organo-aminosilane gas.

Figure 17:
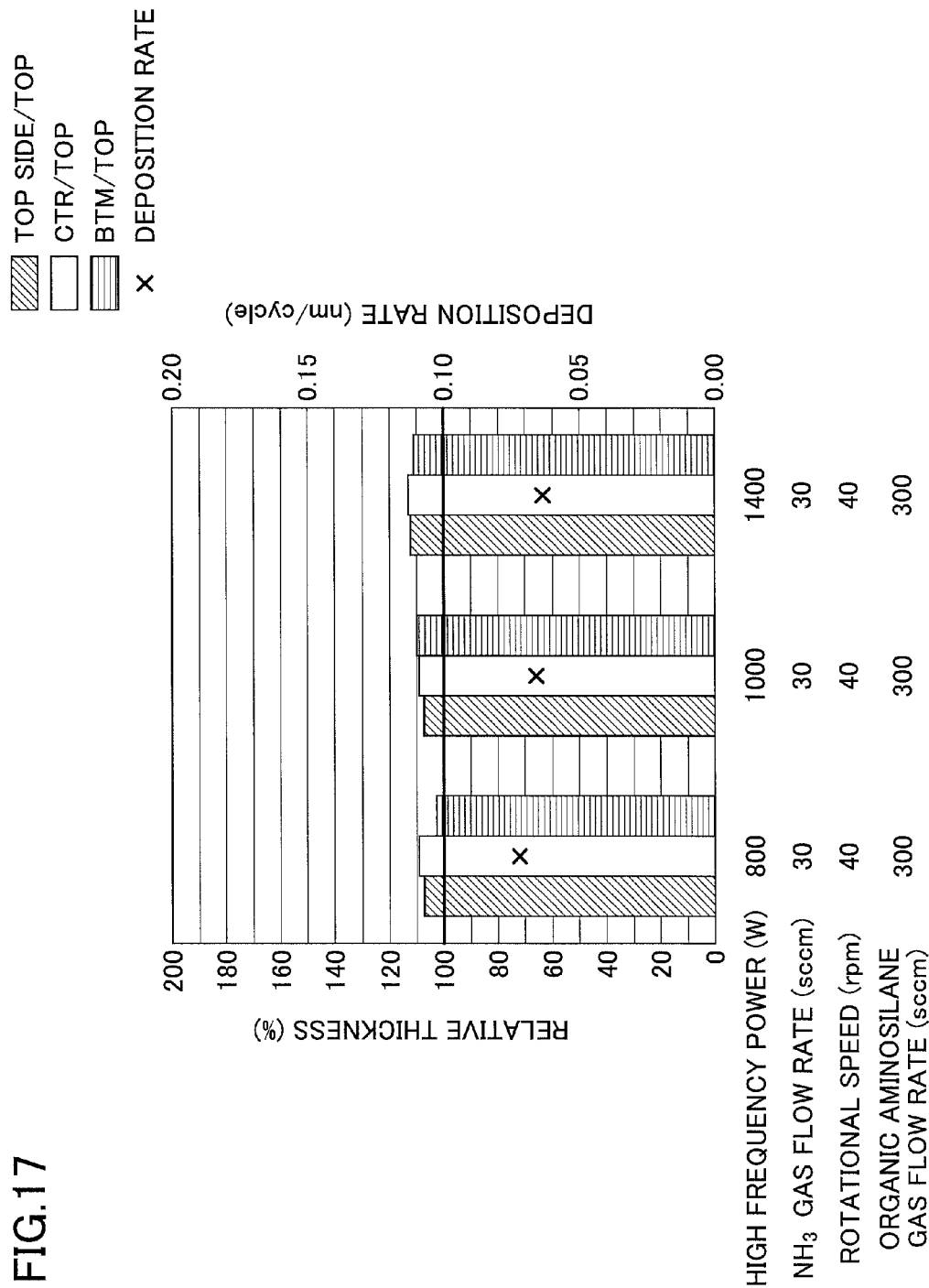
FIG. 17 is a view showing a result of an example.

Further, as shown in FIG. 17, it is confirmed that the thickness of the silicon oxide film deposited in the hole can be made substantially uniform by further adjusting the high frequency power, the flow rate of the hydrogen containing gas, the rotational speed, and the flow rate of the organo-aminosilane gas.

EXAMPLE 2

In this example, the silicon oxide film is deposited in accordance with the film deposition method of the alternative example 4. This means that the first film deposition step in which the thickness at the bottom surface of the hole becomes greater, and the second film deposition step in which the thickness near the aperture of the hole becomes greater are performed. The conditions for the first film deposition step and the second film deposition step are as follows. In this example, the hydrogen ($H_2$) gas is used as the hydrogen containing gas supplied from the gas introduction nozzle 92.

(First Film Deposition Step)
    the flow rate of the organo-aminosilane gas from the reaction gas nozzle 31: 900 sccm
    the flow rate of the ozone gas from the reaction gas nozzle 32: 1.8 g/min
    the flow rate of the $H_2$ gas from the gas introduction nozzle 92: 45 sccm
    the rotational speed of the turntable 2: 20 rpm
    high frequency power: 1400 W
    wafer temperature: 400° C.
    deposition period: 16 minutes (corresponding to the targeted thickness of 32 nm at the TOP)

(Second Film Deposition Step)
    the flow rate of the organo-aminosilane gas from the reaction gas nozzle 31: 75 sccm
    the flow rate of the ozone gas from the reaction gas nozzle 32: 1.8 g/min
    the flow rate of the $H_2$ gas from the gas introduction nozzle 92: 45 sccm
    the rotational speed of the turntable 2: 240 rpm
    high frequency power: 1400 W
    wafer temperature: 400° C.
    deposition period: 3.7 minutes (corresponding to the targeted thickness of 18 nm at the TOP).

Figure 18:
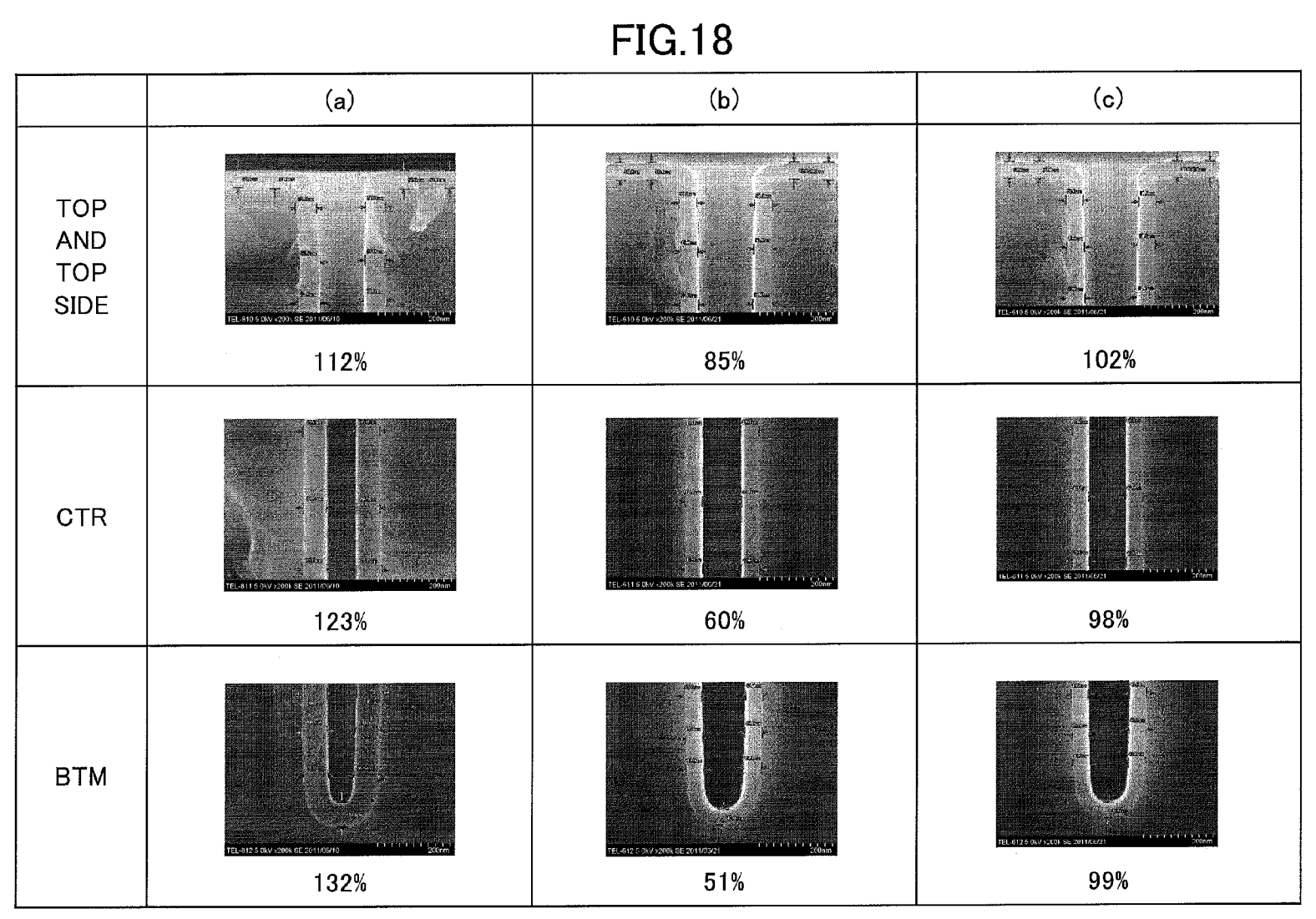

FIG. 18 is a view including SEM views of the result of the example. The values shown in each of the drawings express the respective thickness normalized by the thickness at the TOP. Here, (a) of FIG. 18 shows a result in which only the first film deposition step is performed, and (b) of FIG. 18 shows a result in which only the second film deposition step is performed without performing the first film deposition step.

In the first film deposition step, as shown in (a) of FIG. 18, the thicknesses at the TOP side, the CTR, and the BTM are greater than the thickness at the TOP, and further the thicknesses are greater at the BTM, the CTR, and the TOP side in this order (the thickness at the bottom surface side of the hole is the greatest).

On the other hand, in the second film deposition step, compared with the case of the first film deposition step, the flow rate of the organo-aminosilane gas is reduced and the rotational speed of the turntable 2 is increased. With these influences, as shown in (b) of FIG. 18, the thicknesses at the BTM, the CTR, and the TOP side are less in this order (the thickness at the bottom surface side of the hole is the least).

Part (c) of FIG. 18 shows a result of a case where the first film deposition step and the second film deposition step are successively performed. As shown, the normalized thicknesses at the TOP side, the CTR, and the BTM are within a range between 98% to 102%. This means that the thickness at the TOP (the surface of the wafer near the hole) and the thicknesses at the positions at the inner surface of the hole (the TOP side, the CTR, and the BTM) are almost 50 nm, respectively. Thus, according to the film deposition method of the alternative example 4, the thickness of the silicon oxide film can be made uniform not only in the hole but also at the surface of the wafer.

The present invention is not limited to the specifically disclosed embodiments, and variations and modifications may be made without departing from the scope of the present invention.

For example, in the above embodiments, the plasma generating device 80 is a so-called inductive coupling plasma (ICP) source including the antenna 85. However, the plasma generating device 80 may adopt a capacitively coupled plasma (CCP) source in which plasma is generated by applying high frequency to two rod electrodes extending in a parallel relationship with each other. Even when the CCP source is used, the oxygen plasma can be similarly generated and the above advantages can be obtained.

Further, the Si containing gas supplied from the reaction gas nozzle 31 is not limited to the organo-aminosilane gas as long as it can be adsorbed onto the OH radicals, and may be organosilicon compound gas. Further, the oxidation gas supplied from the reaction gas nozzle 32 is not limited to the $O_3$ gas, and may be $O_2$ (oxygen) gas or a mixture gas of $O_2$ and $O_3$, for example.

Further, as long as it is possible to be adsorbed onto the OH radicals, an organometallic gas may be supplied from the reaction gas nozzle 31, for example. For example, zirconium oxide (ZrO) can be deposited by supplying an organometallic gas containing zirconium (Zr) from the reaction gas nozzle 31 as the organometallic gas while supplying the $O_3$ gas or the like from the reaction gas nozzle 32. In this case, the thickness of ZrO deposited on the inner surface of the trench or the like can be controlled. Here, Tetrakis (Ethylmethylamino) Zirconium (TEMAZ) may be used as the Zr containing organometallic gas.

Further, alternatively, the organometallic gas may be the organometallic gas containing aluminum (Al). An aluminum oxide (AlO) film may be deposited by supplying the Al containing organometallic gas from the reaction gas nozzle 31 while supplying the $O_3$ gas or the like from the reaction gas nozzle 32. Here, Trimethyl Aluminum (TMA), or Dimethylethylamine alane, for example, may be used as the Al containing organometallic gas. Further, it is possible to form a ZrAlO film by complementarily supplying the Zr containing organometallic gas and the Al containing organometallic gas from the reaction gas nozzle 31.

Further, for the hydrogen containing gas supplied to the inner space S of the plasma generating device 80 via the gas introduction nozzle 92, both the $NH_3$ gas and the $H_2$ gas may be used. Further, as long as a gas is capable of generating the OH radicals, the gas is not limited to the $NH_3$ gas or the $H_2$ gas; for example, $H_2O$ (water), $H_2N-NH_2$ (hydrazine), $H_2O_2$ (hydrogen peroxide), carbon hydride gas or the like may be used.

The plasma generating device which generates the oxygen plasma for improving the density or the quality of the silicon oxide film may be provided separately from the plasma generating device 80 which generates the plasma for controlling the distribution of the OH radicals. In this case, in the plasma generating device for controlling the distribution of the OH radicals, as long as the adsorbed OH radicals can be eliminated and the OH radicals are generated in the plasma, it is not necessary to generate the oxygen plasma.

Further, the above embodiments are applicable to deposit a film on an inner surface of a space of a line and space pattern, a via hole, a trench via or the like, in addition to the trench.

According to the embodiment, a film deposition method is capable of controlling the thickness distribution of a film which is deposited in a concave portion formed on a substrate.

The following embodiments are also included.

According to an embodiment, there is provided a film deposition method of depositing a reaction product of a first reaction gas and a second reaction gas capable of reacting with the first reaction gas, including a step of adsorbing in which hydroxyl radicals are adsorbed at a desired distribution on an inner surface of a concave portion formed at a surface of a substrate, a step of supplying the first reaction gas to the inner surface of the concave portion on which the hydroxyl radicals are adsorbed, and a step of generating the reaction product on the inner surface by having the first reaction gas adsorbed onto the inner surface of the concave portion react with the second reaction gas.

The desired distribution of the hydroxyl radicals corresponds to a desired thickness distribution of the film deposited in the concave portion, so that the distribution of the hydroxyl radicals is controlled to provide the desired thickness distribution.

For example, in a method of manufacturing a semiconductor integrated circuit, when the film is to be formed to be thicker at the bottom surface side of the concave portion and thinner at the aperture side so that the concave portion is filled with the film without the void, the hydroxyl radicals are adsorbed with a distribution which can provide such thickness distribution of the film. Further, when the film is to be uniformly formed on the entire inner surface of the concave portion, the hydroxyl radicals are adsorbed with a distribution which can provide such thickness distribution of the film.

Further, the hydroxyl radicals can be adsorbed inside the concave portion with a desired distribution by selectively eliminating the hydroxyl radicals generated by the reaction of a first reaction gas and a second reaction gas and adsorbed inside the concave portion.

Further, according to another embodiment, there is provided a film deposition method which deposits a reaction product of a first reaction gas and a second reaction gas which reacts with the first reaction gas, including a first step and a second step as follows.

The first step includes a step in which the hydroxyl radicals are adsorbed onto an inner surface of the concave portion formed at a surface of a substrate with a distribution in which the thickness of the reaction product is greater at the bottom surface side; a step of supplying the first reaction gas to the inner surface of the concave portion onto which the hydroxyl radicals are adsorbed, and a step of forming the reaction product by allowing the first reaction gas react with the second reaction gas.

The second step includes a step in which the hydroxyl radicals are adsorbed onto an inner surface of the concave portion formed at the surface of the substrate with a distribution in which the thickness of the reaction product is greater at the aperture side of the concave portion, a step of supplying the first reaction gas to the inner surface of the concave portion onto which the hydroxyl radicals are adsorbed, and a step of forming the reaction product by allowing the first reaction gas to react with the second reaction gas.

Here, the above "first" of the first step and the "second" of the second step are simply used to differentiate the steps and do not express the order. Thus, the first step may be performed after performing the second step.

Although a preferred embodiment of the film deposition method has been specifically illustrated and described, it is to be understood that minor modifications may be made therein without departing from the spirit and scope of the invention as defined by the claims.

What is claimed is:

1. A film deposition method using a film deposition apparatus including
   a chamber into which a first reaction gas, which tends to be adsorbed onto hydroxyl radicals, and a second reaction gas capable of reacting with the first reaction gas are supplied, and
   a turntable provided in the chamber, a substrate provided with a concave portion being mounted on the turntable and a film of a reaction product of the first reaction gas and the second reaction gas being formed on the substrate, the method comprising:
   a step of controlling an adsorption distribution of the hydroxyl radicals in a depth direction in the concave portion of the substrate;
   a step of supplying the first reaction gas on the substrate onto which the hydroxyl radicals are adsorbed; and
   a step of supplying the second reaction gas on the substrate onto which the first reaction gas is adsorbed.

2. The film deposition method according to claim 1, wherein the step of controlling the adsorption distribution includes a step of exposing the substrate onto which the hydroxyl radicals are adsorbed to oxygen plasma.

3. The film deposition method according to claim 2, wherein in the step of exposing the substrate to the oxygen plasma, the oxygen plasma includes a hydrogen containing gas.

4. The film deposition method according to claim 3, wherein in the step of exposing the substrate to the oxygen plasma, the adsorption distribution of the hydroxyl radicals in the depth direction in the concave portion of the substrate is controlled by controlling the flow rate of the hydrogen containing gas.

5. The film deposition method according to claim 2, wherein the second reaction gas is capable of depositing the film as well as generating the hydroxyl radicals on the film by reacting with the first reaction gas,
   wherein in the step of exposing the substrate to the oxygen plasma, the substrate onto which the hydroxyl radicals generated by a reaction between the first reaction gas and the second reaction gas are adsorbed, is exposed to the oxygen plasma.

6. The film deposition method according to claim 2, wherein in the step of exposing the substrate to the oxygen plasma, a predetermined high frequency power is supplied as well as supplying an oxygen containing gas.

7. The film deposition method according to claim 6, wherein in the step of exposing the substrate to the oxygen plasma, the adsorption distribution of the hydroxyl radicals in the depth direction in the concave portion of the substrate is controlled by controlling the predetermined high frequency power.

8. The film deposition method according to claim 6, wherein the substrate is configured to pass through a first gas supplying area in which the first reaction gas is supplied, a second gas supplying area in which the second reaction gas is supplied, and a third gas supplying area in which the oxygen containing gas is supplied as well as the predetermined high frequency power is supplied, in this order by rotating the turntable, and
   wherein the adsorption distribution of the hydroxyl radicals in the depth direction in the concave portion of the substrate is controlled by controlling a rotational speed of the turntable.

9. The film deposition method according to claim 2, wherein in the step of exposing the substrate to the oxygen plasma, the adsorption distribution of the hydroxyl radicals in the depth direction in the concave portion of the substrate is controlled by controlling a period in which the substrate is exposed to the oxygen plasma.

10. The film deposition method according to claim 1, wherein the step of supplying the first reaction gas includes a step of controlling a period in which the first reaction gas is supplied to the substrate.

11. The film deposition method according to claim 1, wherein in the step of supplying the first reaction gas, the flow rate of the first reaction gas is controlled.

12. The film deposition method according to claim 1, further comprising:
    a first step in which the step of supplying the first reaction gas and the step of supplying the second reaction gas are performed while the adsorption distribution of the hydroxyl radicals is controlled such that the amount of the hydroxyl radicals is small at a shallow portion while the amount of the hydroxyl radicals is large at a deeper portion in the depth direction of the concave portion of the substrate in the step of controlling an adsorption distribution of the hydroxyl radicals.

13. The film deposition method according to claim 12, further comprising:
    a second step in which the step of supplying the first reaction gas and the step of supplying the second reaction gas are performed while the adsorption distribution of the hydroxyl radicals is controlled such that the amount of the hydroxyl radicals is small even at the deeper portion in the depth direction of the concave portion of the substrate in the step of controlling an adsorption distribution of the hydroxyl radicals.

14. The film deposition method according to claim 1, wherein the first reaction gas is organo-amino compound gas.

15. The film deposition method according to claim 1, wherein the first reaction gas is organo-aminosilane.

16. The film deposition method according to claim 1, wherein the second reaction gas is an oxygen containing gas.

17. The film deposition method according to claim 1, wherein the second reaction gas is ozone.

18. The film deposition method according to claim 3, wherein the hydrogen containing gas is one of or both of the ammonia and hydrogen.

19. The film deposition method according to claim 1, further comprising:

a step of supplying a plasma generation gas into a plasma space inside the chamber; and a step of generating plasma from the plasma generation gas at the plasma space by inductive coupling using an antenna that faces a surface of the turntable via a faraday shield, the faraday shield being grounded and provided between the antenna and the plasma space, the faraday shield including a plurality of slits aligned in a direction perpendicularly intersecting the antenna; and wherein in the step of controlling the adsorption distribution, the substrate is exposed to the plasma generated by the antenna in the plasma space.

* * * * *